United States Patent
Sharif et al.

(10) Patent No.: US 7,423,430 B1
(45) Date of Patent: Sep. 9, 2008

(54) ADAPTIVE PARALLEL ACQUISITION AND RECONSTRUCTION OF DYNAMIC MR IMAGES

(75) Inventors: Behzad Sharif, Urbana, IL (US); Yoram Bresler, Urbana, IL (US); Nitin Aggarwal, Champaign, IL (US)

(73) Assignee: The Board of Trustees of the University of Illinois, Urbana, IL (US)

( * ) Notice: Subject to any disclaimer, the term of this patent is extended or adjusted under 35 U.S.C. 154(b) by 0 days.

(21) Appl. No.: 11/697,421

(22) Filed: Apr. 6, 2007

(51) Int. Cl.
*G01V 3/00* (2006.01)

(52) U.S. Cl. ...................... 324/309; 600/416
(58) Field of Classification Search ................ 324/309, 324/307, 306, 300; 600/410, 416
See application file for complete search history.

(56) References Cited

U.S. PATENT DOCUMENTS

| | | | | |
|---|---|---|---|---|
| 6,038,466 | A * | 3/2000 | Haselhoff | 600/410 |
| 6,088,611 | A * | 7/2000 | Lauterbur et al. | 600/407 |
| 6,295,464 | B1 * | 9/2001 | Metaxas | 600/407 |
| 7,005,853 | B2 | 2/2006 | Tsao et al. | |
| 7,053,613 | B2 * | 5/2006 | Lin | 324/307 |
| 7,283,859 | B2 * | 10/2007 | Madore | 600/410 |
| 2006/0208730 | A1* | 9/2006 | Kozerke et al. | 324/307 |

FOREIGN PATENT DOCUMENTS

WO WO 2005/022185 A1 3/2005
WO WO 2006/029240 A2 3/2006

OTHER PUBLICATIONS

Bruno Madore, Unfold-Sense: A Parallel MRI Method With Self-Calibration and Artifact Suppression, Magnetic Resonance in Medicine 52:310-320(2004).
Jeffrey Tsao, On The Unfold Method, Magnetic Resonance in Medicine 47:202-207 (2002).
Felix A Breuer et al, Dynamic Autocalibrated Parallel Imaging Using Temporal GRAPPA (TGRAPPA), Magnetic Resonance in Medicine 53:981-985 (2005).
Jeffrey Tsao, k-t Blast and k-t Sense: Dynamic MRI With High Frame Rate Exploiting Spatiotemporal Corrections, Magnetic Resonance in Medicine 50:1031-1042 (2003).

* cited by examiner

*Primary Examiner*—Louis M Arana
(74) *Attorney, Agent, or Firm*—Quarles & Brady LLP

(57) ABSTRACT

A method for acquiring magnetic resonance (MR) data from a dynamic object in which a k-space sampling schedule are produced. The k-space sampling table is produced using a spatio-temporal model of the beating heart, time sequential sampling theory and a known number of parallel receive channels (coils). The imaging pulse sequence is repeated to play out the phase encodings in the order listed in the k-space sampling schedule and the k-space data sets acquired through the parallel receive channels are combined and used to reconstruct a sequence of images. The method is an improved process for dynamic MRI, designed to overcome the limitations of current MRI systems in imaging dynamic phenomena and produces highly accurate motion movies of the structure, function, perfusion and viability of various anatomical regions in MRI subjects such as the beating heart, flow of contrast agents in blood vessels, brain excitation, or joint movement.

23 Claims, 11 Drawing Sheets

FIG. 10
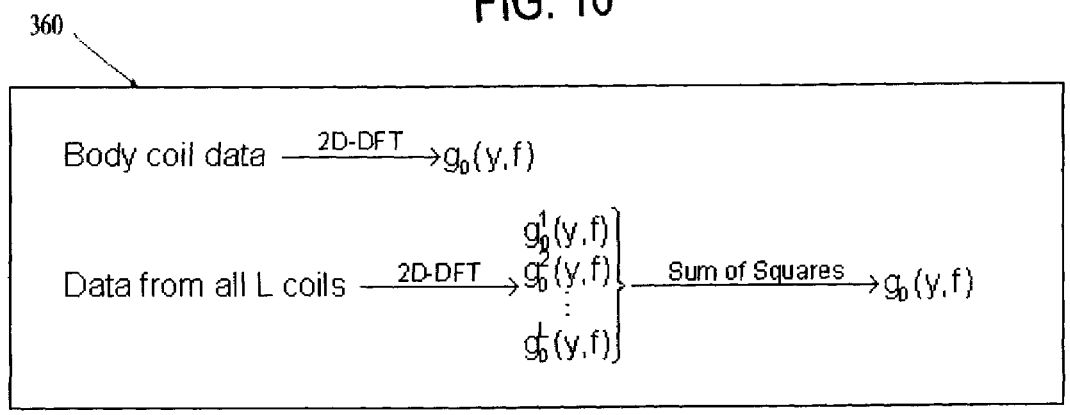
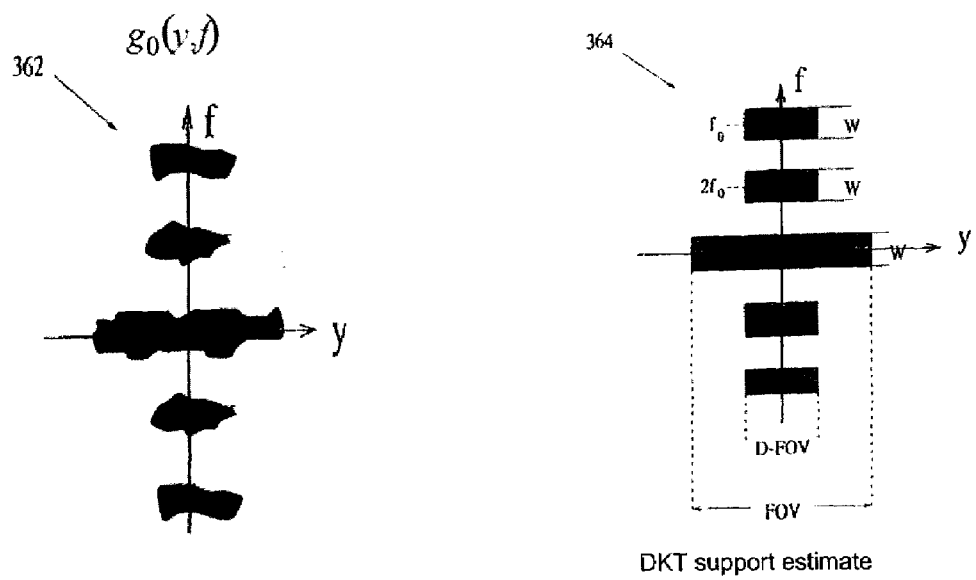
DKT support estimate

ADAPTIVE PARALLEL ACQUISITION AND RECONSTRUCTION OF DYNAMIC MR IMAGES

STATEMENT REGARDING FEDERALLY SPONSORED RESEARCH

This invention was made with government support under contract Number BES02-01876 awarded by the National Science Foundation. The United States Government has certain rights in this invention.

BACKGROUND OF THE INVENTION

The field of the invention is magnetic resonance imaging (MRI) methods and systems. More particularly, the invention relates to methods for MR imaging of dynamically moving objects, such as the beating heart, at a high spatial and temporal resolution.

Any nucleus which possesses a magnetic moment attempts to align itself with the direction of the magnetic field in which it is located. In doing so, however, the nucleus precesses around this direction at a characteristic angular frequency (Larmor frequency) which is dependent on the strength of the magnetic field and on the properties of the specific nuclear species (the magnetogyric constant of the nucleus). Nuclei which exhibit this phenomena are referred to herein as "spins".

When a substance such as human tissue is subjected to a uniform, static magnetic field (polarizing field $B_0$), the individual magnetic moments of the spins in the tissue attempt to align with this polarizing field, but precess about it in random order at their characteristic Larmor frequency. A net magnetic moment $M_z$ is produced in the direction of the polarizing field, but the randomly oriented magnetic components in the perpendicular, or transverse, plane (x-y plane) cancel one another. If, however, the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$, which is rotating, or spinning, in the x-y plane at the Larmor frequency. The practical value of this phenomenon resides in the signal that is emitted by the excited spins after the excitation signal $B_1$ is terminated. There are a wide variety of measurement sequences in which this nuclear magnetic resonance ("NMR") phenomenon is exploited.

When utilizing NMR to produce images, a technique is employed to obtain NMR signals from specific locations in the subject. Typically, the region that is to be imaged (region of interest) is scanned by a sequence of NMR measurement cycles which vary according to the particular localization method being used. The resulting set of received NMR signals, or "views", are digitized and processed to reconstruct the image using one of many well known reconstruction techniques. To perform such a scan, it is, of course, necessary to elicit NMR signals from specific locations in the subject. This is accomplished by employing magnetic fields ($G_x$, $G_y$, and $G_z$) that have the same direction as the polarizing field B0, but which have a gradient along the respective x, y and z axes. By controlling the strength of these gradients during each NMR cycle, the NMR signal can be spatially "encoded", i.e., the spatial distribution of spin excitation can be controlled and the location of the resulting NMR signals can be identified.

The present invention can be used with a wide variety of spatial encoding techniques, including 2D and 3D, Fourier imaging and Projection imaging methods. For concreteness, it will be described in detail with reference to a variant of the Fourier transform (FT) imaging technique, which is frequently referred to as "spin-warp". The spin-warp technique is discussed in an article entitled "Spin Warp NMR Imaging and Applications to Human Whole-Body Imaging" by W. A. Edelstein et al., Physics in Medicine and Biology, Vol. 25, pp. 751-756 (1980). It employs a variable amplitude phase encoding magnetic field gradient pulse prior to the acquisition of NMR spin-echo signals to phase-encode spatial information in the direction of this gradient. In a two-dimensional implementation (2DFT), for example, spatial information is encoded in one direction by applying a phase encoding gradient ($G_y$) along that direction, and then a signal is acquired in the presence of a readout magnetic field gradient ($G_x$) in a direction orthogonal to the phase encoding direction. The readout gradient present during the acquisition encodes spatial information in the orthogonal direction. In a typical 2DFT pulse sequence, the magnitude of the phase encoding gradient pulse Gy is incremented ($\Delta G_y$) in the sequence of views that are acquired during the scan to produce a set of NMR data from which an entire image can be reconstructed.

Object motion during the acquisition of NMR image data produces both blurring and "ghosts". Ghosts are particularly apparent when the motion is periodic, or nearly so. For most physiological motion each view of the NMR signal is acquired in a period short enough that the object may be considered stationary during the acquisition window. In such case, the blurring and ghosting is due to the inconsistent appearance of the object from view to view. Motion that changes the appearance between views such as that produced by a subject moving, by the respiration or the cardiac motion, or by peristalsis, is referred to hereinafter as "view-to-view motion". Motion may also change the amplitude and phase of the NMR signal as it evolves during the pulse sequence and such motion is referred to hereinafter as "in-view motion".

Both blurring and ghosting can be reduced if the data acquisition is synchronized with the functional cycle of the object to reduce view-to-view motion. This method is known as "gated" NMR scanning, and its objective is to acquire NMR data at the same instance during successive functional cycles so that the object "looks" the same in each view. The drawback of gating is that NMR data may be acquired only during a small fraction of the object's functional cycle, and even when the shortest acceptable pulse sequence is employed, the gating technique can significantly lengthen the data acquisition. Also, if the object motion does not repeat exactly from cycle to cycle, the reconstructed images represent the object time-averaged over several such cycles during which the data was acquired, rather than the object and its true dynamics. Furthermore, the imperfect cycle-to-cycle repetition results in residual view-to-view motion and image artifacts.

Another method for eliminating ghost artifacts is disclosed in U.S. Pat. No. 4,567,893, issued on Feb. 4, 1986. This prior patent teaches that the distance in the image between the ghosts and the object being imaged is maximized when the NMR pulse sequence repetition time is an odd multiple of one-fourth of the duration of the periodic signal variation. This can be used to alleviate ghosts due to respiratory motion. While this method, indeed, improves image quality, it does impose a constraint on the NMR pulse sequence repetition time and it often results in a longer total scan time. It also assumes that the motion is periodic which does not hold in practice.

Yet another method for reducing the undesirable effects due to periodic signal variations is disclosed in U.S. Pat. No.

4,706,026 issued on Nov. 10, 1987 and entitled "A Method For Reducing Image Artifacts Due to Periodic Variations in NMR Imaging." In one embodiment of this method, an assumption is made about the signal variation period (for example, due to subject respiration) and the view order is altered from the usual monotonically increasing phase-encoding gradient to a pre-selected view order. For a given signal variation period, a view order is chosen so as to make the NMR signal variation as a function of the phase-encoding amplitude be at a desired frequency. In one embodiment, the view order is selected such that the variation period appears to be equal to the total NMR scan time (low frequency) so that the ghost artifacts are brought as close to the object being imaged as possible. In another embodiment (high frequency), the view order is chosen to make the variation period appear to be as short as possible so as to push the ghost artifacts as far from the object as possible.

This prior method is effective in reducing artifacts, and is in some respects ideal if the variation is rather regular and at a known frequency. On the other hand, the method is not robust if the assumption made about the motion temporal period does not hold (e.g., because the subject's heart rate changes or is irregular). If this occurs, the method loses some of its effectiveness because the focusing of the ghosts, either as close to the object or as far from the object as possible, becomes blurred. A solution to this problem is disclosed in U.S. Pat. No. 4,663,591 which is entitled "A Method For Reducing Image Artifacts Due To Periodic Signal Variations in NMR Imaging." In this method, the non-monotonic view order is determined as the scan is executed and is responsive to changes in the period so as to produce a desired relationship (low frequency or high frequency) between the signal variations and the gradient parameter. The effectiveness of this method, of course, depends upon the accuracy of the means used to sense the subject motion, and particularly, any variations in the periodicity of that motion.

Imaging the heart is a particularly challenging problem. The heart itself is in motion (cardiac motion) and overlying this motion is translational, rotational and compressive motion due to breathing (respiratory motion). In certain applications, like imaging of the head or knees, it is often possible to limit the motion by asking the subject to voluntarily hold still or by using physical restraints to immobilize the part being imaged. However, for applications like cardiac imaging, it is not possible to eliminate the motion during the time period of MR data acquisition. Hence, for such applications it is necessary to develop methods for acquiring MR images in the presence of physiological motion. Also, capturing "snapshot" images of the heart is much different than acquiring a dynamic movie of the heart. Whereas in the first case motion may be compensated for, in the second, motion is to be recovered. For either goal so-called "retrospective" motion correction methods may be used after the NMR data is acquired, or "prospective" motion compensation methods may be used to adapt the MR data acquisition itself to compensate or capture the motion.

A recent technique used to shorten scan time is referred to generally as "parallel magnetic resonance imaging" (PMRI) and is sometimes referred to as "partial parallel MRI". PMRI techniques use spatial information from arrays of RF detector coils to substitute for the encoding which would otherwise have to be obtained in a sequential fashion using field gradients and RF pulses. The use of multiple effective detectors has been shown to multiply imaging speed, without increasing gradient switching rates or RF power deposition.

Three such parallel imaging techniques that have recently been developed and applied to in vivo imaging are SENSE (SENSitivity Encoding), SMASH (simultaneous acquisition of spatial harmonics, disclosed in U.S. Pat. No. 5,910,728 issued on Jun. 8, 1999) and GRAPPA (generalized autocalibrating partially parallel acquisitions, disclosed in U.S. Pat. No. 6,841,998 issued on Jan. 11, 2005). These techniques include the parallel use of a plurality of separate receiving coils, with each coil having a different sensitivity profile. The combination of the separate NMR signals produced by these coils enables a reduction of the acquisition time required for an image (in comparison with conventional Fourier image reconstruction) by a factor which in the most favorable case equals the number of the receiving coils used as explained by Pruessmann et al., Magnetic Resonance in Medicine Vol. 42, p. 952-962, 1999. For pulse sequences that execute a rectilinear trajectory in k-space, parallel imaging techniques usually reduce the number of phase encoding steps in order to reduce imaging time, and then use the coil sensitivity information to make up for the loss of spatial information.

A complementary method for reducing imaging time is the model-based approach that uses a priori information, in the form of a mathematical model, about the imaged object to reduce the amount of spatially encoded data that needs to be acquired by the MR scanner. For the cardiac imaging application, one such technique is the method of UNFOLD (B. Madore et al., Magn. Reson. Med., vol. 42, pp. 813-828, November 1999). UNFOLD assumes that the heart is located in the central half of the imaged field of view, and makes further assumptions about the temporal dynamics of the heart and the rest of the thoracic slice. These assumptions, if valid, provide an acceleration factor of two, i.e. only half the conventional amount of data needs to be collected. Combining this with the PMRI technique SENSE, the method of UNFOLD-SENSE (disclosed in U.S. Pat. No. 6,714,010 issued on Mar. 30, 2004) doubles the acquisition speed by skipping every other phase-encode line. Compared to UNFOLD, it provides superior artifact suppression for accelerations factors somewhat larger than two.

The method of k-t BLAST (disclosed in U.S. Pat. No. 7,005,853 issued on Feb. 28, 2006) uses a training data set to introduce prior knowledge in the image reconstruction process in form of correlations in both spatial and temporal directions. The method of k-t SENSE (disclosed in the same U.S. patent) combines k-t BLAST with the PMRI technique SENSE. It provides higher accelerations than previously discussed methods. However these methods by themselves do not eliminate the need for cardiac gating. Also since the data acquisition approach is not tailored to the particular subject being imaged, these methods are non-adaptive. As such, their performance gains are not as high as the current invention and depend upon the assumed generic model being valid for the particular imaged subject.

As disclosed in the University of Illinois Master of Science Thesis of Qi Zhao published in 2002 and entitled "Optimal Adaptive Dynamic MRI Based On time Sequential Sampling Theory," a spatio-temporal model of cardiac motion has been developed and used to prospectively adapt the MR data acquisition k-space sampling scheme such that cardiac motion artifacts are suppressed. This adaptive MR acquisition and image reconstruction method is described in co-pending U.S. patent application Ser. No. 11/217,805 filed on Sep. 1, 2005 and entitled "Adaptive Acquisition and Reconstruction of Dynamic MR Images". This method constructs a mathematical model for the cardiac dynamics and uses the model to, (1) adapt the MR data acquisition and, (2) reconstruct the dynamic object from acquired data. These methods can form high spatial and temporal reconstructions of the object under modeling assumptions, but the performance gains may be limited because this method does not take advantage of the parallel imaging hardware that is available on most modern scanners.

SUMMARY OF THE INVENTION

The present invention is a method for acquiring MR image data and reconstructing an image in which a parallel imaging technique with sensitivity encoding is combined with a patient-adaptive acquisition and reconstruction method.

A model is used to capture information about the spatial and temporal characteristics of the imaged slice or volume in the particular subject being imaged. This model, along with information about the RF coils, is used to adapt the MR data acquisition and the cine reconstruction. The invention reduces the MR data acquisition rate and the amount of MR data needed to be acquired, and thus accelerates the imaging process. It also improves the achievable spatial and temporal resolutions and the image quality, evaluated in such terms as artifacts and signal-to-noise ratio (SNR).

BRIEF DESCRIPTION OF THE DRAWINGS

FIG. 10 is a graphic illustration of the data processing steps that are used to derive the DKT support of the imaged object from MR data acquired during a prescan stage that forms part of the method of FIG. 8;

GENERAL DESCRIPTION OF THE INVENTION

Figure 1:
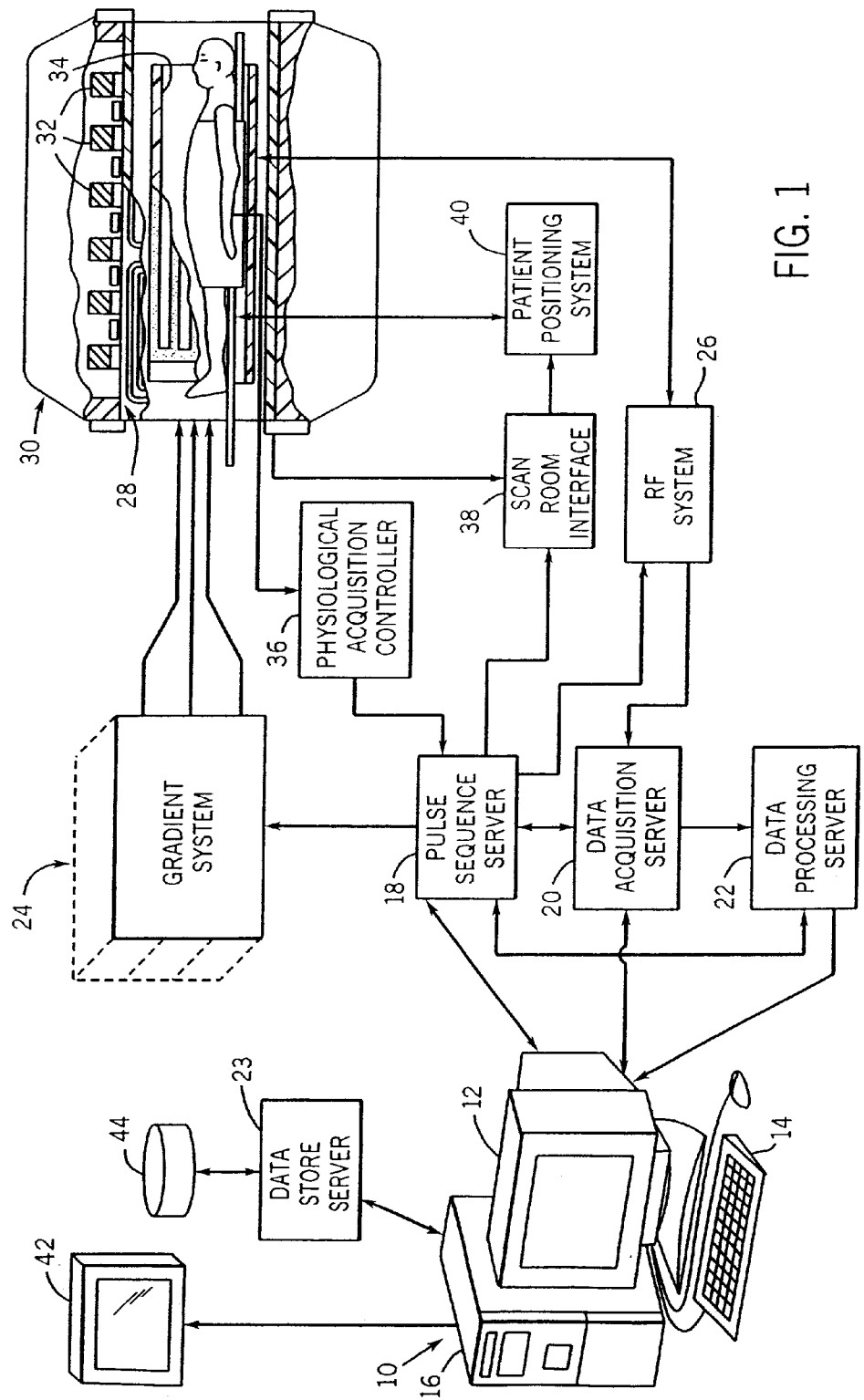
FIG. 1 is a block diagram of an MRI system that employs the present invention.

In one embodiment, the present invention enables high resolution cardiac images or cine to be acquired while the subject is holding his/her breath, without gating each MR acquisition with an ECG signal. The MR data acquisition and reconstruction are adapted to the cardiac motion of the subject being imaged as well as the characteristics of the receiver coil-array available as parallel imaging hardware. As a result, the method reconstructs artifact-free motion movies of the dynamic object with high spatial and temporal resolutions. Furthermore, the method is capable of optimizing a variety of image-quality measures such as signal-to-noise (SNR), contrast-to-noise (CNR), etc. The method can also be used to image other parts of the anatomy affected by cardiac or other motion in humans or animals.

The following, is a theoretical and mathematical description of the imaging process prescribed by the invention. The order in which these steps are performed can be varied and some of the steps can be combined into one, as will be discussed in the detailed description presented below.

I. Estimation of the coil characteristic: At this prescan step, we estimate the coil characteristics, for example, coil sensitivity profiles and MR data noise statistics for all the channels in the receiver coil array. These estimates can also be updated during later stages based on the MR data acquired during the imaging scan.

II. Dynamic Model Estimation (DME): At this prescan step we acquire MR and/or auxiliary data (e.g. ECG signal from the subject) in order to adapt the model parameters to the motion of the particular subject being imaged. The dynamic model can be further refined using the MR data acquired during the imaging scan.

III. Design of Sampling Schedule: We design the k-space sampling schedule by solving an optimization problem of the form described in Eq. (2) below.

IV. Scanning: During the imaging scan we acquire MR data as prescribed by the optimal k-space sampling schedule designed at the previous step. Complementary reference data may also be acquired at this step.

V. Image Reconstruction: Finally an MR image (or cine) is reconstructed from the MR data acquired from all coils during the imaging scan, as well as the estimated dynamic model and the coil characteristics. This is achieved by solving an optimization problem of the form given in Eq. (3a) or (3b) below.

In the following description, the Time-Varying Object (TVO) being imaged is denoted variously by I(r,t) and H(r,t); where r is the d-dimensional (d=2, 3) spatial variable and t is the temporal variable. Fourier transforms of signals are indicated by the variables used, e.g., $I(k_x, y, f)$ is the Fourier transform of I(x, y, t) along the x and t axes; k denotes the spatial frequency, e.g., $k_x$ and $k_y$ refer to spatial-frequency along the x and y axes, respectively, and f denotes the temporal frequency.

OBSERVATION MODEL: The observation model describes how the data collected by the MR scanner is related to the object being imaged. For parallel MRI, the observation equation is written as follows:

$$D_l(k, t) = \int_{FOV} s_l(r)I(r, t)e^{-j2\pi k^T r} dr \qquad \text{Eq. (1)}$$

where $s_l(r)$, l=1, 2, ..., L denotes the complex spatial sensitivity profile. The data collected by the l-th coil for a TVO is given by samples of $D_l(k,t)$ acquired according to the specified sampling schedule $\Psi$; additional data noise can also be incorporated in the above equation. We denote the set of acquired parallel MR data by D and the set of coil related parameters, including the coil sensitivity profiles and noise characteristics, by $\mathcal{P}$. As is described in detail later, these parameters are estimated during the prescan stage and used to optimize both the MR data acquisition and reconstruction processes.

OBJECT MODEL: The idea behind using an object model is to incorporate information about the spatial and temporal dynamics of the TVO into the MR data acquisition and reconstruction process. In the case of cardiac imaging, by adjusting the model parameters to the observed characteristics of the subject's beating heart, we can adapt the MR imaging process to the particular subject being imaged.

We denote a dynamic object model parameterized by a set of parameters $\alpha$ by $\mathcal{M}(\alpha)$. During the Dynamic Model Estimation stage of our imaging process, we use MR or auxiliary data (such as ECG) in order to adapt the model to the particular subject being imaged. We denote the optimal set of parameters found at the DME stage by $\alpha^*$.

DESIGN OF SAMPLING SCHEDULE: A sampling schedule prescribes the MR data that needs to be acquired at each time instant during the MR scan. As part of our imaging scheme, we design the sampling schedule $\Psi^*$, adapted to the model $\mathcal{M}(a^*)$, by solving an optimization problem of the following form:

$$\Psi^* = \underset{\Psi \in \Upsilon}{\operatorname{argmin}} C_A[Q(M(\alpha^*), \Psi, P), \Psi, P] \qquad \text{Eq. (2)}$$

where Q is a measure of the expected quality of the reconstruction, which depends upon the MR sampling schedule $\Psi$, our model of the object being imaged $\mathcal{M}(\alpha^*)$, as well as the imaging parameters $\mathcal{P}$. $C_A$ is our image-acquisition cost function that penalizes for loss in image quality and deviation from the desired properties of the sampling schedule (for instance, total acquisition time, specific absorption rate, repetition time requirement, etc.) imaged. We constrain our search to only those sampling schedules that can guarantee reconstruction of the TVO I(x,y,t) at the desired spatial and temporal resolutions. We refer to the set of all sampling schedules with such a property, as the Feasible Set of Sampling Schedules and denote the set by $\Upsilon$ RECONSTRUCTION SCHEME: As part of our imaging scheme, the TVO is reconstructed using the acquired data D from all coils by incorporating the information provided by the object model $\mathcal{M}(\alpha^*)$ as well as knowledge of the coil characteristics captured by $\mathcal{P}$. This is accomplished by solving an optimization problem of the following form:

$$I^* = \underset{I \in M(\alpha^*)}{\operatorname{argmin}} C_R[I, D, \Psi, P] \qquad \text{Eq. (3a)}$$

where $C_R$ is our image-reconstruction cost function that accounts for data fidelity (which requires knowledge of D, $\mathcal{P}$ and $\Psi$), prior knowledge on noise characteristics (included in $\mathcal{P}$), etc.

The reconstruction scheme defined by Eq. (3a) is applicable for the cases where we have adequate estimates of the object model parameters $\alpha^*$, and coil characteristics $\mathcal{P}$ available from the prescan stage (specifically from the estimation of the coil characteristics and DME steps described later in detail). However, in general, we can also refine or improve our estimates of the object model or coil characteristics, or both, at the reconstruction stage, by solving a joint optimization problem. For instance, if $\alpha_0$ represents the dynamic model and $\mathcal{P}_0$ represents the coil parameters estimated using the prescan data, the joint optimization problem during the reconstruction step can be expressed as $$(I^*, \alpha^*, P^*) = \underset{\alpha, P, I \in M(\alpha)}{\operatorname{argmin}} C_J[I, D, \Psi, P, \alpha_0, P_0] \qquad \text{Eq. (3b)}$$

where $C_J$ is the joint cost function that accounts for data fidelity as well as our a priori knowledge about the object model, coil characteristics, etc. As an example, the cost function can ensure that the refined dynamic object model parameters $\alpha^*$ are close to ones computed using the prescan data $\alpha_0$, where closeness of model parameters is defined in terms of a suitable mathematical metric.

It should be clear that the joint reconstruction in Eq. 3(b) can use the MR data acquired during prescan in addition to the data acquired at the scan stage. Similarly, the formulation is easily extended to the scenario where MR or auxiliary reference data (as defined below) is acquired during the prescan or scan stage.

We can also refine the dynamic model or coil parameter estimates, after the scan acquisition is only partially complete, and use these updated models to re-compute the dynamic sampling schedule itself by solving an optimization problem of the form provided in Eq. (2). Thus, the sampling schedule and model parameters can be updated online in (almost) real time. This procedure is particularly useful in scenarios where the modeled characteristics of the TVO are expected to change significantly during the time-interval of the scan itself, e.g., for the case of cardiac imaging in which the subject exhibits high heart-rate variability; or if the coil characteristics are expected to change, e.g., due to resistive heating of the coils.

We now describe some specific examples of object models that may be used with our method and an overview of the corresponding imaging schemes. Algorithmic details are presented in the Preferred Embodiment section.

DKT SUPPORT MODELS: Various classes of dynamic models can be used in the general method described above. We, next, discuss models based on the Dual k-t (DKT) support of the cardiac TVO. For spinwarp imaging, the DKT support for a cardiac TVO I(r,t) is defined as $\beta_1 \triangleq \operatorname{supp}\{I(r,f)\}$. Recall that the support of a function defined on a domain S is the set of points in S at which the function is non-zero. Because the spectral support of an object of a finite extent (in either space or time) is unbounded, we instead consider the "essential support" that contains a sufficient fraction of the energy, or other desired measure of concentration of the function.

Figure 4:
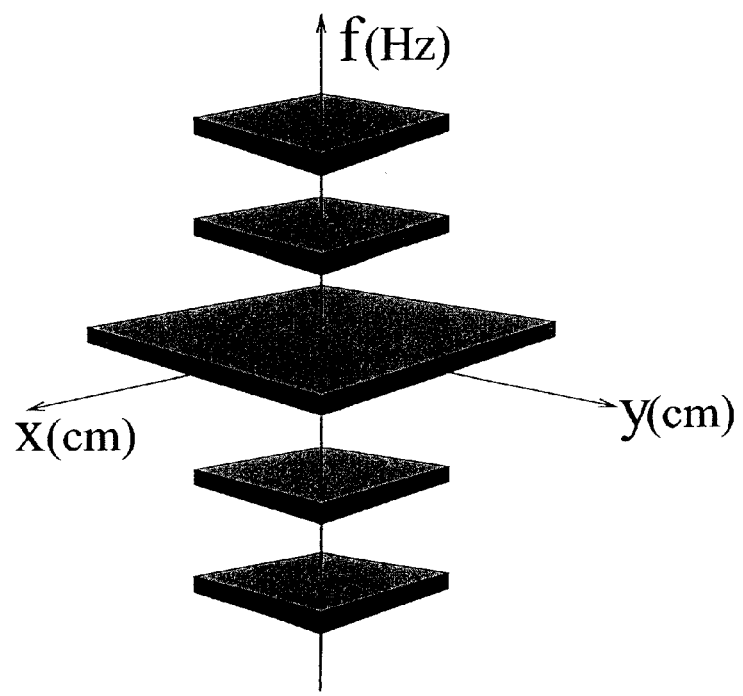
FIG. 4 is a graphic illustration of a dual k-t support for the time-varying image of an aperiodic beating heart.

A particular DKT support model, referred to as the "Banded Spectral Model" may be used. This model characterizes the cardiac TVO (in the absence of respiratory motion), I(r,t), by its DKT support $\beta_1$ of the form shown in FIG. 4. This model captures the following characteristics of the dynamic object: (1) the finite spatial field-of-view (FOV) outside which the function is zero; (2) the approximate periodicity of the cardiac motion reflected in the quasi-harmonic banded temporal spectrum with frequency spacing determined by the heart-rate; and (3) the spatial localization of the fast motion to the heart region defining the dynamic field-of-view (D-FOV).

DETERMINING CARDIAC DYNAMICS MODEL PARAMETERS: Before imaging the object we estimate the parameters used to model the spatial and temporal dynamics of the object using MR and/or auxiliary data (like ECG). For example, when using the Banded Spectral Model, we need to determine the number and widths of harmonic bands along with the total FOV and D-FOV of the imaged object. As elaborated in more detail below, this is done through an automated prescan procedure called Dynamic Model Estimation.

OPTIMAL MODEL-ADAPTED PARALLEL MR ACQUISITION AND RECONSTRUCTION: An MR acquisition schedule includes specification of the order and/or time instants at which MR data is acquired. It can also specify the imaging slice (or volume) and the positions in k-space at which k-space samples are acquired at each time-instant. We consider MR acquisition schedules that satisfy the following two properties; (P1) an alias-free reconstruction of the object at the specified resolution can be obtained from the acquired data, subject to the modeling assumptions and (P2) the acquisition scheme is time-sequential (TS) i.e. at any given time instant only a single view of the object is obtained (for example data along a single line, curve, or plane in k-space is acquired). Data acquired within a time interval in which object motion can be neglected is considered to be a single time-instant for our purpose.

For any given DKT support model, several such sampling schemes may exist, although some of them may be impractical due to hardware or other constraints. To reduce the requirements on the MR hardware and SAR, we choose the eligible MR acquisition scheme that optimizes a predefined criterion such as minimizing the requirement on the k-space sampling speed or optimizes the specified image quality measure while belonging to the Feasible Set of Sampling Schedules. The design method uses the DKT support of the object and produces an optimal TS sampling schedule $\Psi^{TS} = \{K^{TS}(n), nT_R\}_n$; where $T_R$ is the repetition time and $K^{TS}(n)$ is the set of k-space locations sampled at time $nT_R$. For MR imaging of 2D slices, the sampling schedule also specifies which slice is selected at each of the sampling time instants.

Note that the same k-space location may be sampled multiple times at different acquisition time instants. The number of times that the same k-space point is sampled may depend on several factors including: the accuracy needed in the reconstructed image; the shape of the DKT support (e.g., the width of the bands in a banded model); and limits on the total acquisition time.

Besides the MR data specified by the dynamic sampling schedule, we may also acquire supplementary data during the imaging scan using the MR scanner or auxiliary devices, such as an ECG monitor or respiratory bellows. Such data is referred to as reference data and is used to, (1) improve estimates of the coil characteristics, (2) improve estimates of the dynamic model, (3) provide information about the spatial or temporal dynamics of the imaged object, such as heart rate and its variability, respiratory motion or drift, etc. The information provided by the reference data is used during the reconstruction steps in order to improve the image quality, as is explained below in more detail for the example of time-warped cardiac models. Note that reference data may also be acquired during the prescan stage; either to improve the dynamic model or coil characteristics estimates, or to be used during the image (cine) reconstruction stage.

We can design the TS sampling schedule so that it contains gaps, i.e. for some integer values of n, we do not sample any location in k-space, while still being able to reconstruct the TVO (at same temporal and spatial resolution) from the acquired data-set. These gaps in the TS sampling schedule can be used instead to acquire reference data using MR navigator pulse sequences, for example, navigator data that is used to estimate the time-warp as described below, or using them to estimate subject motion due to respiration or other causes as described in the article entitled "Navigator Echoes in Cardiac Magnetic Resonance" by David Firmin and Jenny Keegan published in the Journal of Cardiovascular Magnetic Resonance, vol. 3, pp. 183-193, 2001. The average frequency and exact placement of these gaps can be controlled during the dynamic sampling schedule design stage. However, increasing the gap frequency may reduce the required repetition time $T_R$.

The adaptive acquisition design method can be modified to find an MR acquisition scheme that satisfies additional constraints such as a limit on the maximum permissible repetition time for the pulse sequence or fulfills other optimality conditions such as maximizing SNR or CNR. The condition (P2) can also be modified, so that more than one line, curve, or plane in k-space is acquired at one time. The TVO can be reconstructed from the TS-sampled data by solving an optimization problem of the form described in Eq. (3a).

TIME-WARPED CARDIAC MODELS: The cardiac model based on the DKT support of the time-varying image can be modified and extended to derive other cardiac imaging schemes. We present two methods that model the joint spatial and temporal-spectral characteristics of the beating heart. Furthermore we also explicitly model the aperiodicity of cardiac motion in the time-interval of interest by introducing a time-warp.

The TVO models that we consider for cardiac applications are expressed as:

$$I(r,t) = H(r, \phi(t)) \qquad \text{Eq. (4)}$$

where $\phi(t)$ represents the warping of the time-axis to account for the aperiodicity of the heart (for example due to heart rate variability); and $H(r,t)$ represents an idealized chest cross-section. The function $\phi(t)$ is assumed to be monotonic in the time-interval of interest and to be approximately equal to t. Note that for the case when $\phi(t)=t$ there is no time-warping. $H(r,t)$ is zero outside the FOV and $H(k, t)$ has significant energy only for $k \in \mathcal{K}$. This general model encompasses a wide variety of proposed cardiac imaging models but we focus on two models defined by a particular choice of the DKT support $\beta_H = \text{supp}\{H(r, f)\}$ of the TVO.

Time-Warped Harmonic Model: Adopting a temporally periodic model for the idealized cardiac TVO, each of its pixels is modeled as a sum of harmonically related complex sinusoids. The idealized cardiac TVO is thus expressed as:

$$H(r, t) = \sum_{m=-M}^{M} \alpha_m(r) e^{j 2\pi m f_0 t} \qquad \text{Eq. (5)}$$

Figure 3:
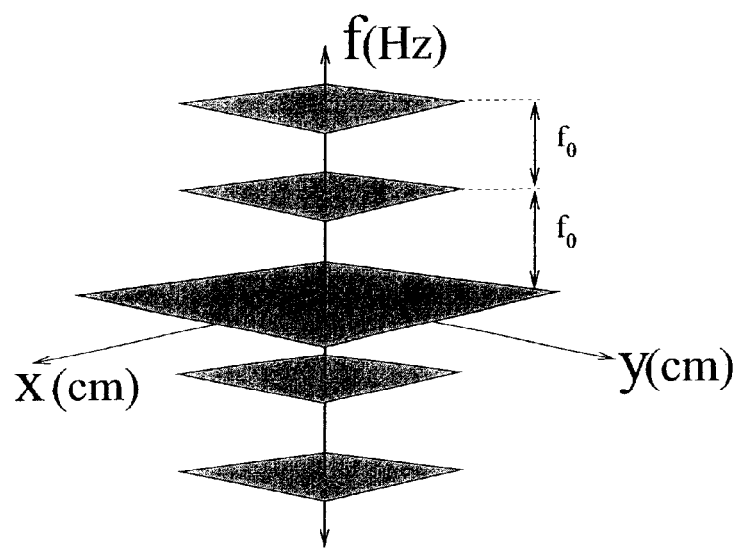
FIG. 3 is a graphic illustration of a dual k-t support for the time-varying image of a periodic beating heart.

However, since the heart itself occupies only a fraction of the field of view, we expect only pixels corresponding to that portion of the image to have significant temporal variation and the rest of the image to be essentially static. This knowledge is incorporated in the model by imposing the constraint:

$$\alpha_m(r) = 0 \text{ if } \begin{cases} m = 0 \text{ and } r \notin FOV \\ m \neq 0 \text{ and } r \notin DFOV \end{cases} \qquad \text{Eq. (6)}$$

where the dynamic region of the image is limited to DFOV. The DKT support $\beta_H$ corresponding to this model is illustrated in FIG. 3. Although this model assumes that the idealized cardiac TVO $H(r,t)$ is periodic in time, $I(r, t)$ itself is, in general, aperiodic owing to the time-warp. It should be noted that $I(r, t)$ is a cyclic function of t, since for any fixed $r=r_0$ it is the composition of a periodic temporal function, $I(r_0, t)$, with a monotonic 'time-warp' function $\phi(t)$. Indeed the time-warp causes broadening of the line spectrum and $\beta_I = \text{supp}[I(r, f)]$ to have a form similar to that in FIG. 4.

Time-Warped Banded Spectral Model: In this model, the idealized cardiac TVO, $H(r, t)$ itself is assumed to have a banded $\beta_H$ of the form shown in FIG. 4 and the effect of the time-warp is simply to further broaden the temporal-spectral bands. The finite width of the temporal-spectral bands is introduced to account for any residual aperiodicity which may not be modeled by the time-warp (for example, to account for beat-to-beat variation in cardiac motion). Although this model is more general than the time-warped harmonic model, it also leads to a more complicated reconstruction algorithm involving reconstruction of multi-band signals from non-uniform samples rather than a parameter estimation approach that can be used with the first model.

The effect of the time-warp $\phi(t)$ is to broaden the temporal spectrum of I(r, t) when compared to H(r, t). The average rate at which we need to sample a multi-dimensional function in order to reconstruct it without aliasing, depends on the occupied volume (area in the 2-D case) of its spectral support. One would thus expect that faster sampling is needed to reconstruct I(r, t) than for reconstructing H(r, t). However, we show how to estimate the time-warp $\phi(t)$ independently, and instead reconstruct H(r, t) from its samples (acquired at a slower rate) and then use equation (10) below to obtain I(r, t). Thus, by modeling the cardiac aperiodicity explicitly we reduce the required k-space sampling rate during the scan.

As for the banded spectral cardiac model, we design the Time-Sequential sampling schedule for time-warped cardiac models based on the measured DKT support. However instead of the broadened DKT support of the time-warped function I(r, t), we base the design on the narrower DKT support for the idealized cardiac function H(r, t) in order to design the TS sampling schedule $\Psi^*$.

During imaging data acquisition we acquire data as determined by the previously designed TS sampling schedule $\Psi^*$, that determines the sequence and time-instants at which k-space is sampled. Since we also need to estimate the time-warp $\phi(t)$ during this acquisition stage, we simultaneously acquire time-warp navigator data, which is an example of reference data, by sampling the center of k-space at, say, $k_y=0$. This can be done, for example, by repeating the imaging pulse sequence without phase encoding or by using a single image pulse sequence that acquires two NMR echo signals per excitation, with the first echo used for acquiring imaging data and the second echo used for acquiring reference data. The time-warp navigator data is dewarped to obtain the estimate of $\phi(t)$ during the acquisition stage. The basis for dewarping is that given a cyclic function, we can dewarp each of its periods to obtain the underlying periodic function and estimate the time-warp. The dewarping operation is done efficiently using dynamic programming based algorithms. One such algorithm was described in "Dynamic Programming algorithm optimization of spoken word recognition" by H. Sakoe and S. Chiba in IEEE Transactions on Acoustics, Speech and Signal Processing, 26:43-49, 1978. Instead of using MR navigator data one can also use reference data from other sources such as an ECG signal to obtain this $\phi(t)$ estimate.

An alternative approach to estimating the time-warp function $\phi(t)$, is to use a parametric model. An example of such a parametric model may be expressed as:

$$\varphi(t) = t + \sum_{n=1}^{N} b_n \varphi_n(t) \, t \in [0, T] \qquad \text{Eq. (7)}$$

where, $\phi_n(t)$ are the known expansion functions and; [0,T] is the time-interval of interest and $b_n$ are the unknown time-warp expansion coefficients. Possible choices of the expansion functions include the ones for polynomial time-warp model in which, $\phi_n(t)=t^{n+1}$, as described in, "Dynamic Magnetic Resonance Imaging based on optimal sampling and time-varying harmonic model", by Q. Zhao, N. Aggarwal and Y. Bresler, in Proc. ISMRM, 10, 2002. For an idealized cardiac TVO H(r, t) that is approximately temporally-periodic, the MR data can be related to the time-warp model as follows:

$$I(k, t) = \sum_{m=-M}^{M} \alpha_m(k) e^{j2\pi m f_0 \varphi(t)} + \varepsilon(k, t) \qquad \text{Eq. (8)}$$

$$= \sum_{m=-M}^{M} \alpha_m(k) e^{j2\pi m f_0 [t + \sum_{n=1}^{N} b_n \varphi_n(t)]} + \varepsilon(k, t)$$

where $\epsilon(k,t)$ is the residual function that accounts for modeling errors and noise. Using Eq. (8), we can estimate the unknown quantities using, for instance, the least-squares approach and the set of acquired data $\{D_l(k^{TS}(n), nT_R)\}_{l=1}^{L}$ on the sampling schedule $\Psi^*$, i.e., $$\{\alpha_m(k), b_n, f_0\} = \underset{\{\alpha_m(k), b_n, f_0\}}{\mathrm{argmin}}$$

$$\sum_{l=1}^{L} \sum_{(k,t) \in \Psi^*} \left| D_l(k, t) - \sum_{m=-M}^{M} [\alpha_m(k) * s_l(k)] e^{j2\pi f_0 [t + \sum_{n=1}^{N} b_n \varphi_n(t)]} \right|^2$$

where, $*$ denotes the 1D convolution operator, $s_l(r)$ is the sensitivity profile of the l-th coil as in Eq. (1). From this estimate of the time-warp expansion coefficients, the time-warp can itself be estimated using Eq. (7). Again, it should be clear, that instead of MR reference data one can use data from other sources such as an ECG signal to obtain this $\phi(t)$ estimate.

Reconstruction for Time-Warped Harmonic Model: To reconstruct the object I(r, t) we need to estimate the model parameters $f_0$ and $\{\alpha_m(r)\}$. First, the fundamental temporal frequency $f_0$ is estimated from the dewarped MR time-warp navigators using nonlinear least-squares. Next, the $\{\alpha_m(r)\}$ are estimated using the acquired data $\{D_l(k^{TS}(n), nT_R)\}_{l=1}^{L}$ as follows. Define $I_l(r, t) \triangleq s_l(r)/(r, t)$. Combining Eq. (4) and Eq. (5) and taking the Fourier transform with respect to r we have:

$$I_l(r, nT_R) = \sum_{m=-M}^{M} (s_l(r)\alpha_m(r)) e^{j2\pi m f_0 \varphi(nT_R)} \Rightarrow \qquad \text{Eq. (9)}$$

$$D_l(k^{TS}(n), nT_R) = \sum_{m=-M}^{M} \left( \int_{FOV} s_l(r)\alpha_m(r) e^{-j2\pi k^{TS}(n)^T r} dr \right) e^{j2\pi m f_0 \varphi(nT_R)}$$

Since I(r, t) is essentially band-limited in k, $s_l(r)\alpha_m(r)$ can be discretized on a rectangular grid. This relation along with the constraints of Eq. (6), yields an over-determined system of linear equations for the unknown $\alpha$'s (on the discretization grid), which we solve in the least-squares sense. In the case of 2D imaging, an inverse Fourier transform along $k_x$ is applied to the acquired data $\{D_l(k_x,k_y(n),nT_R)\}_{l=1}^{L}$. Discretizing the y axis using a step size of $\Delta y=1/W_y$, where $W_y$ is the maximum (over all coils) of the essential bandwidth of $I_l(r, t)$ along $k_y$, Eq. (9) becomes:

$$D_l(x, k_y(n), nT_R) = \sum_{m=-M}^{M} \left( \sum_{p=-P}^{P} s_l(x, p\Delta y)\alpha_m(x, p\Delta y) e^{-j2\pi p\Delta y k_y(n)} \right) e^{j2\pi m f_0 \varphi(nT_R)}$$

and can be written in the form of a matrix equation which is overdetermined if the number of data samples is larger than 4(M+1)(P+1). Finally, the overdetermined matrix equation is solved for, e.g., using the Moore-Penrose pseudo-inverse computed by a stable numerical method such as QR factorization.

It should be apparent that if a parametric model is used to model the time-warp, then the time-warp expansion coefficients $\{b_n\}$, and the TVO model parameters $f_0$ and $\{\alpha_m(r)\}$ can be estimated jointly, using Eq. (8) and Eq. (9).

Reconstruction for Time-Warped Banded Spectral Model: From Eq. (4) it is seen that the acquired data $\{D_l(k^{TS}(n),nT_R)\}_{l=1}^{L}$ corresponds to samples of H(k, t) non-uniformly spaced in warped time. However we know that the spectrum of H (in (r,f)) has support $\beta_H$, and we need to estimate the values of H(r,t) for arbitrary r and t from this knowledge. This is the classical problem of bandlimited reconstruction from non-uniform samples and can be solved using various known methods, including those described in the paper "Efficient numerical methods in non-uniform sampling theory" by Feichtinger, H. G.; Grochenig, K.; and Strohmer, T., published in Numerische Mathematik, vol. 69, n 4, pp. 423-40, 1995. Here, we describe one approach. Let $\Omega$ be the set of all functions H(r, t) that are (i) consistent with the data, (ii) have the correct support in (r,f), and (iii) have energy bounded by some finite constant E; then we choose the reconstruction $\hat{H}(r,t)$ to be the one minimizing the worst case reconstruction error;

$$\hat{H}(r, t) = \underset{H \in \Omega}{\operatorname{argmin}} \underset{U \in \Omega}{\sup} \|H(r, t) - U(r, t)\| \quad \text{Eq. (10)}$$

The solution to this problem is found using the Yen interpolator and, if desired, I(r,t) can be recovered using Eq. (4).

DESCRIPTION OF THE PREFERRED EMBODIMENT

For the preferred embodiment we describe the application of our method to imaging of a 2D cardiac slice using a spin-warp pulse-sequence. For notational convenience, x, y and z are chosen to be the desired readout, phase-encoding and slice-select gradient axes respectively. Embodiments for other imaging prescriptions, like 3D imaging or projection imaging (radial sampling in k-space) can be analogously derived based on the general description discussed above.

MR IMAGING SYSTEM: Referring first to FIG. 1, there is shown the major components of a preferred MRI system that incorporates the present invention. The MRI system includes a workstation 10 having a display 12 and a keyboard 14. The workstation 10 includes a processor 16 which is a commercially available programmable machine running a commercially available operating system. The workstation 10 provides the operator interface which enables scan prescriptions to be entered into the MRI system.

The workstation 10 is coupled to four servers: a pulse sequence server 18; a data acquisition server 20; a data processing server 22, and a data store server 23.

The pulse sequence server 18 functions in response to program elements downloaded from the workstation 10 to operate a gradient system 24 and an RF system 26. Gradient waveforms necessary to perform the prescribed scan are produced and applied to the gradient system 24 which excites gradient coils in an assembly 28 to produce the magnetic field gradients Gx, Gy and Gz used for position encoding NMR signals. The gradient coil assembly 28 forms part of a magnet assembly 30 which includes a polarizing magnet 32 and a whole-body RF coil 34.

RF excitation waveforms are applied to the RF coil 34 by the RF system 26 to perform the prescribed magnetic resonance pulse sequence. Responsive NMR signals detected by a separate RF coil array described below are received by the RF system 26, amplified, demodulated, filtered and digitized under direction of commands produced by the pulse sequence server 18. The RF system 26 includes an RF transmitter for producing a wide variety of RF pulses used in MR pulse sequences. The RF transmitter is responsive to the scan prescription and direction from the pulse sequence server 18 to produce RF pulses of the desired frequency, phase and pulse amplitude waveform.

The RF system 26 also includes a plurality of RF receiver channels. In the preferred embodiment 8 receiver channels are employed although any number of receive channels may be employed depending on the receive coil array being used. Each RF receiver channel includes an RF amplifier that amplifies the NMR signal received by the coil to which it is connected.

The pulse sequence server 18 also optionally receives patient data from a physiological acquisition controller 36. The controller 36 receives signals from a number of different sensors connected to the patient, such as ECG signals from electrodes or respiratory signals from a bellows. Such signals are typically used by the pulse sequence server 18 to synchronize, or "gate", the performance of the scan with the subject's respiration or heart beat.

The pulse sequence server 18 also connects to a scan room interface circuit 38 which receives signals from various sensors associated with the condition of the patient and the magnet system. It is also through the scan room interface circuit 38 that a patient positioning system 40 receives commands to move the patient to desired positions during the scan.

The digitized NMR signal samples produced by the RF system 26 are received by the data acquisition server 20. The data acquisition server 20 operates to receive the real-time NMR data and provide buffer storage such that no data is lost by data overrun. In some scans the data acquisition server 20 does little more than pass the acquired NMR data to the data processor server 22. However, in scans which require information derived from acquired NMR data to control the further performance of the scan, the data acquisition server 20 is programmed to produce such information and convey it to the pulse sequence server 18. For example, during prescans NMR data is acquired and used to calibrate the pulse sequence performed by the pulse sequence server 18. Also, navigator signals may be acquired during a scan and used to adjust RF or gradient system operating parameters or to control the view order in which k-space is sampled. And, the data acquisition server 20 may be employed to process NMR signals used to detect the arrival of contrast agent in an MRA scan. In all these examples the data acquisition server 20 acquires NMR data and processes it in real-time to produce information which is used to control the scan.

The data processing server 22 receives NMR data from the data acquisition server 20 and processes it in accordance with an image reconstruction method. Images reconstructed by the data processing server 22 are conveyed back to the workstation 10 where they are stored. Real-time images may be output to operator display 12 or a display 42 which is located near the magnet assembly 30 for use by attending physicians. Batch mode images or selected real time images are stored in a host database on disc storage 44. The workstation 10 may be used by an operator to archive the images, produce films, or send the images via a network to other facilities.

Figure 2:
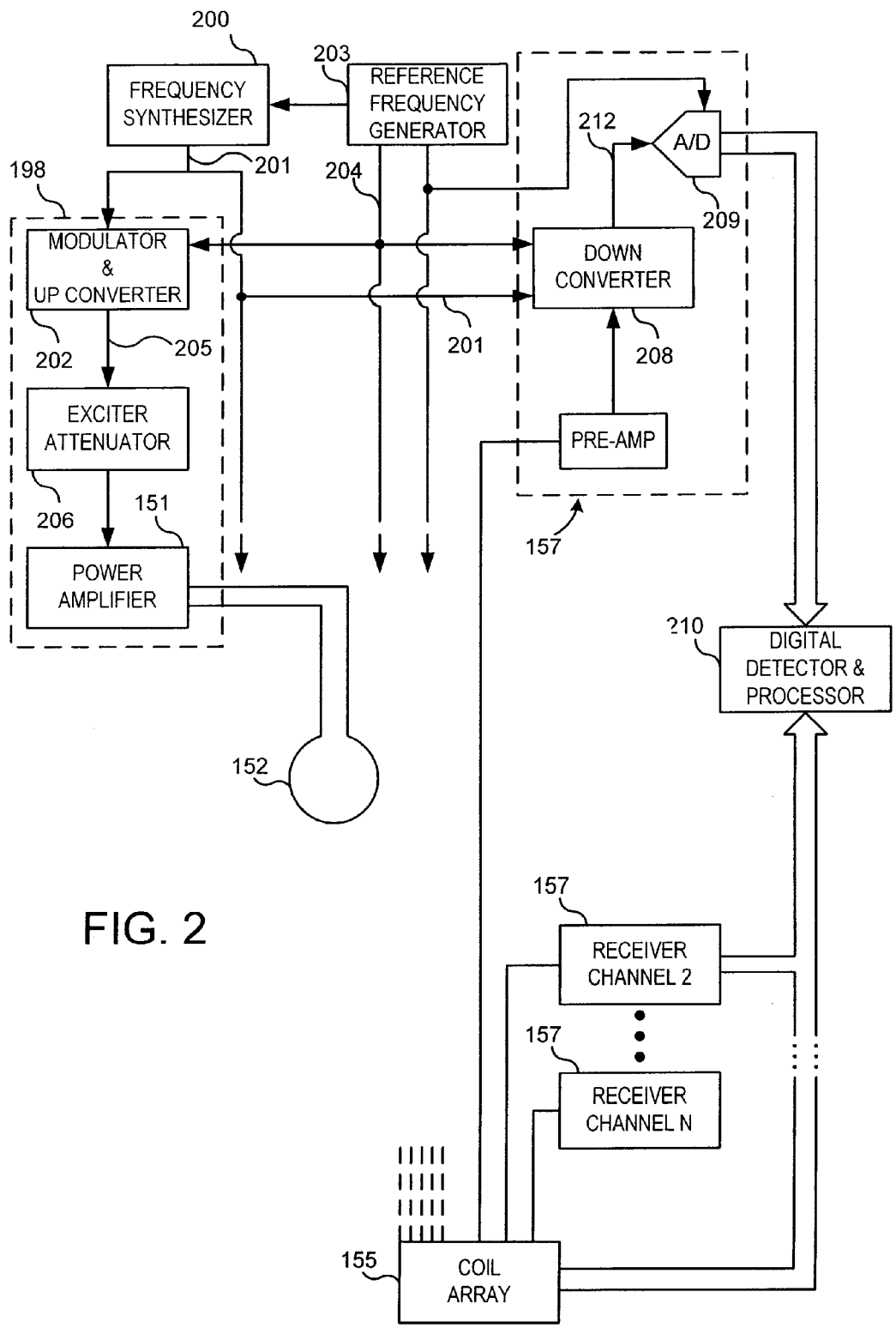
FIG. 2 is an electrical block diagram of the transceiver that forms part of the MRI system of FIG. 1.

Referring particularly to FIG. 2, the RF system 26 includes a transmitter 198 that produces a prescribed rf excitation field. The base, or carrier, frequency of this RF excitation field is produced under control of a frequency synthesizer 200 which receives a set of digital signals from the pulse sequence server 18. These digital signals indicate the frequency and phase of the RF carrier signal produced at an output 201. The RF carrier is applied to a modulator and up converter 202 in the transmitter 198 where its amplitude is modulated in response to a signal R(t) also received from the pulse sequence server 18. The signal R(t) defines the envelope, or waveform, of the RF excitation pulse to be produced and is produced by sequentially reading out a series of stored digital values. These stored digital values may, be changed to enable any desired RF pulse envelope, or waveform, to be produced by the transmitter 198. The RF pulses produced by the transmitter 198 can thus be separately controlled by the pulse sequence server 18.

The magnitude of the RF excitation pulse produced at output 205 is attenuated by an exciter attenuator circuit 206 in the transmitter which also receives a digital command from the pulse sequence server 18. The attenuated RF excitation pulses are applied to a power amplifier 151 in the transmitter 198. The power amplifier is a current source device that connects to the whole body rf coil 152, although local coils may also be used in some clinical applications.

Referring still to FIG. 2 the signal produced by the subject is picked up by a coil array 155 and applied to the inputs of a set of receive channels 157. A pre-amplifier 160 in each receiver cannel 157 amplifies the signal by an amount determined by a digital attenuation signal received from the pulse sequence server 18. The received signal is at or around the Larmor frequency, and this high frequency signal is down converted in a two step process by a down converter 208 which first mixes the NMR signal with the carrier signal on line 201 and then mixes the resulting difference signal with a reference signal on line 204. The down converted NMR signal is applied to the input of an analog-to-digital (A/D) converter 209 which samples and digitizes the analog signal and applies it to a digital detector and signal processor 210 which produces 16-bit in-phase (I) values and 16-bit quadrature (Q) values corresponding to the received signal. The resulting stream of digitized I and Q values of the received signal are output to the data acquisition server 20. The reference signal as well as the sampling signal applied to the A/D converter 209 is produced by a reference frequency generator 203. In the preferred embodiment of the invention the coil array 155 includes only N=8 coil elements and eight corresponding receive channels are employed.

Figure 7:
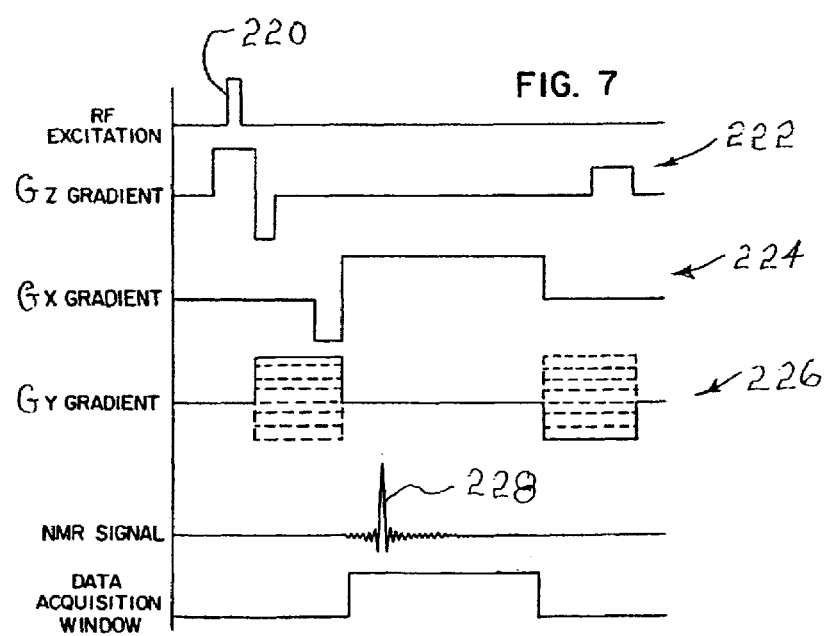
FIG. 7 is a graphic illustration of a preferred imaging pulse sequence used to practice the present invention.

Although a number of fast pulse sequences may be employed to practice the invention, in the preferred embodiment a spoiled gradient-recalled echo sequence or a steady-state gradient-recalled echo pulse sequence such as that shown in FIG. 7 is employed. The pulse sequence includes a selective rf excitation pulse 220 having a prescribed flip angle. The frequency and phase of this excitation pulse 220 can be precisely controlled by the MR scanner hardware as described above. The pulse sequence produces three gradient waveforms $G_z(t)$ 222, $G_x(t)$ 224 and $G_y(t)$ 226. $G_z(t)$ 222 is a slice select gradient, which operates in combination with the selective RF excitation pulse 220 to excite spins in a slice of prescribed thickness and location. $G_x(t)$ 224 is a readout gradient that frequency encodes the NMR signal 228 as it is acquired by the transceiver 150. And finally, $G_y(t)$ is a phase encoding gradient which phase encodes the NMR signal 228 to sample a particular $k_y$ line in k-space. This phase encoding gradient is set to a particular value during each pulse sequence and this value is changed each time the pulse sequence is repeated to sample a different $k_y$ line in k-space. One aspect of the present invention is the order in which the $k_y$ lines of k-space are acquired. As will be explained in more detail below, during a prescan a sampling schedule is produced, and the values in this table are used during the scan to set the phase encoding gradient value during each repeat of the pulse sequence such that the $k_y$ lines in k-space are acquired in the proper order and at the proper time. This sampling schedule is adapted to the cardiac model of the subject being imaged and to the coil sensitivity profiles estimated in the prescan stage. Detailed description of the optimization criterion used to solve for the optimal sampling schedule is set forth below.

Figure 8:
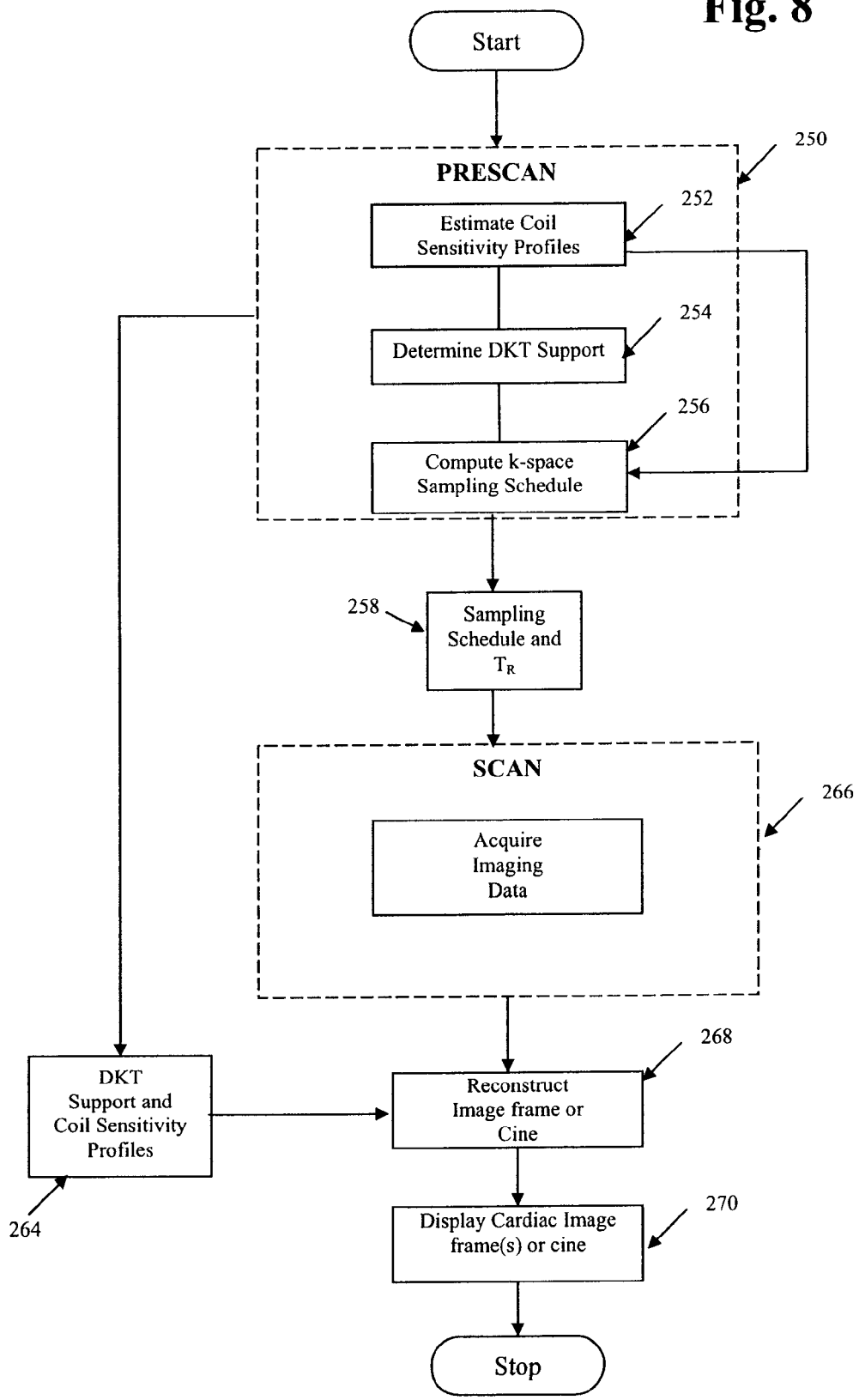
FIG. 8 is a flow chart of the steps in the preferred embodiment of the MR imaging method of the present invention.

IMAGING METHOD OVERVIEW: Referring particularly to FIG. 8, the acquisition and display of cardiac images according to the present invention may be separated into four separate stages: (1) a prescan indicated at process block 250; (2) a scan, or data acquisition step, indicated generally at 266, (3) an image reconstruction step indicated at 268 and, (4) an image display stage indicated at 270.

The prescan 250 itself consists of three stages. As will be explained in detail below, during the prescan at stage 252, data is acquired from the subject of the examination for the purpose of estimating the coil sensitivity profiles (also referred to as sensitivity maps or $B_1$ maps) to be used in later stages. During the prescan at stage 254, MR data, auxiliary data, or both are acquired in order to estimate the object motion model parameters. As will be described in more detail below, the data acquired in stages 252 and 254 is employed at prescan stage 256 to produce an optimal sampling schedule indicated at 258 that adapts the MR data acquisition to the particular subject of this examination and the parallel MR hardware.

After the prescan 250 is completed, the imaging scan is performed as indicated at process block 266 using the previously described imaging pulse sequence. The order and times in which $k_y$ lines of k-space are sampled is determined by the sampling schedule 258. The acquisition prescribed by this sampling schedule 258 is adapted to the cardiac dynamics of the subject and the coil sensitivity profiles.

After the k-space data indicated by the sampling schedule 258 has been acquired, one or more images of the heart at the selected time-instant are reconstructed at process block 268 and displayed as indicated at process block 270. As will be explained in more detail below, this image reconstruction 268 involves more than the usual SENSE reconstruction steps or other standard PMRI reconstruction steps, but still can be computed efficiently. The same data-set can be used to reconstruct the cardiac TVO at different time-instants corresponding to varying cardiac phases.

PRESCAN: Referring particularly to FIG. 8, the purpose of the prescan process 250 is to produce the sampling schedule 258 and an estimate of the coil profiles and DKT support as indicated at 264, which are used during the MRI scan 266 and image reconstruction 268 stages. It should be noted that the order of coil profile estimation 252 and DKT support estimation 256 can be switched. Also, the two steps can be combined resulting in a joint estimation scheme.

COIL PROFILE ESTIMATION: This stage consists of two steps: (1) Reference imaging; and (2) Profile Computation. In the first step, we collect fully-encoded MR data (i.e., MR data sampled in k-space according to the Nyquist sampling requirements determined by the object's field of view) to reconstruct low spatial resolution reference images of the slice of interest during a breath-hold. Typically, a spatial resolution of 64×64 would suffice. Alternatively, in order to avoid the need for a breath-hold, interleaved gradient EPI with half Fourier imaging can be used as described in an article entitled "Cardiac Real-time Imaging Using SENSE" by M. Weiger et al., Magnetic Resonance in Medicine, vol. 43, pp. 177-184 (2000).

In the second step, we compute the sensitivity profiles of all coils using methods as described in an article entitled "SENSE: Sensitivity Encoding for fast MRI" by K. P. Pruessmann et al., Magnetic Resonance in Medicine, vol. 42, pp. 952-962 (1999). Note that, if available, body-coil data can also be used in the estimates. Since the MR data needed to form the set of reference images is acquired in a short interval of time, cardiac motion during acquisition is negligible and its effect on the profile estimates can be ignored. Moreover, by using cardiac gated imaging at this stage, reference images can be made more robust to cardiac motion. In case of low SNR, for each channel, a (weighted) average of the computed coil profile over several cardiac phases would increase the accuracy of the estimate as described in the article by M. Weiger cited above.

As mentioned in the general description of the invention, the coil sensitivity estimates can be further improved during or after the imaging scan stage. For example, one can solve for the coil sensitivities and reconstructed images, which would optimize fidelity of the acquired data. Alternatively, one could use a joint estimation scheme of the form shown in Eq. (3b), and simultaneously solve for both the unknown object, coil sensitivities and dynamic model parameters. Such approaches involve solving a nonlinear optimization problem, for which several numerical techniques are available. Some of the particular algorithms for solving such problems are discussed in a book by Dimitri P. Bertsekas, titled "Nonlinear Programming," ISBN: 1-886529-00-0, Athena Scientific, 2004.

DYNAMIC MODEL ESTIMATION (DME): Recall that the DKT support of the cardiac TVO (in the absence of respiratory motion) is defined as $\beta_I \triangleq \text{supp}\{I(r,f)\}$ where r denotes a spatial variable and f is the temporal frequency. For 2D spin-warp imaging, data is acquired along k-space lines parallel to the (readout) $k_x$-axis. Since data along this readout direction is acquired almost instantaneously (i.e. cardiac motion during the readout time interval is negligible) and is fully sampled, we ignore the effects of sampling along the $k_x$-dimension. Hence we re-define the DKT support $\beta_I$ as follows:

$$\beta_I = \bigcup_x \text{supp}\{I(x, y, f)\} \quad \text{Eq. (14)}$$

where $\bigcup$ denotes the union over all x in the FOV. The aim of the Dynamic Model Estimation is to estimate this DKT support $\beta_I$.

Figure 9A:
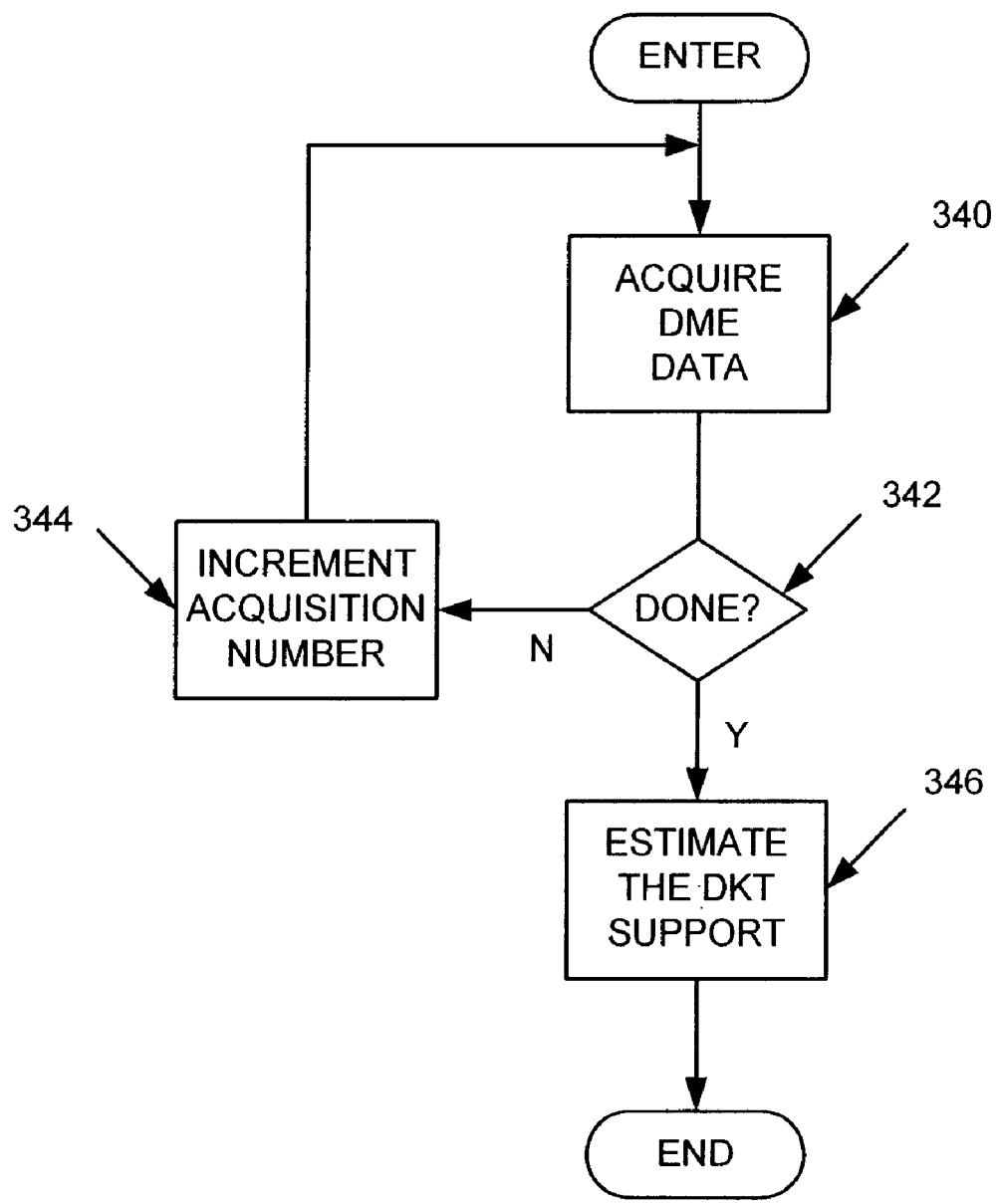
FIGS. 9A and 9B are flowcharts of steps employed in a prescan stage of the method of FIG. 8.
Figure 9B:
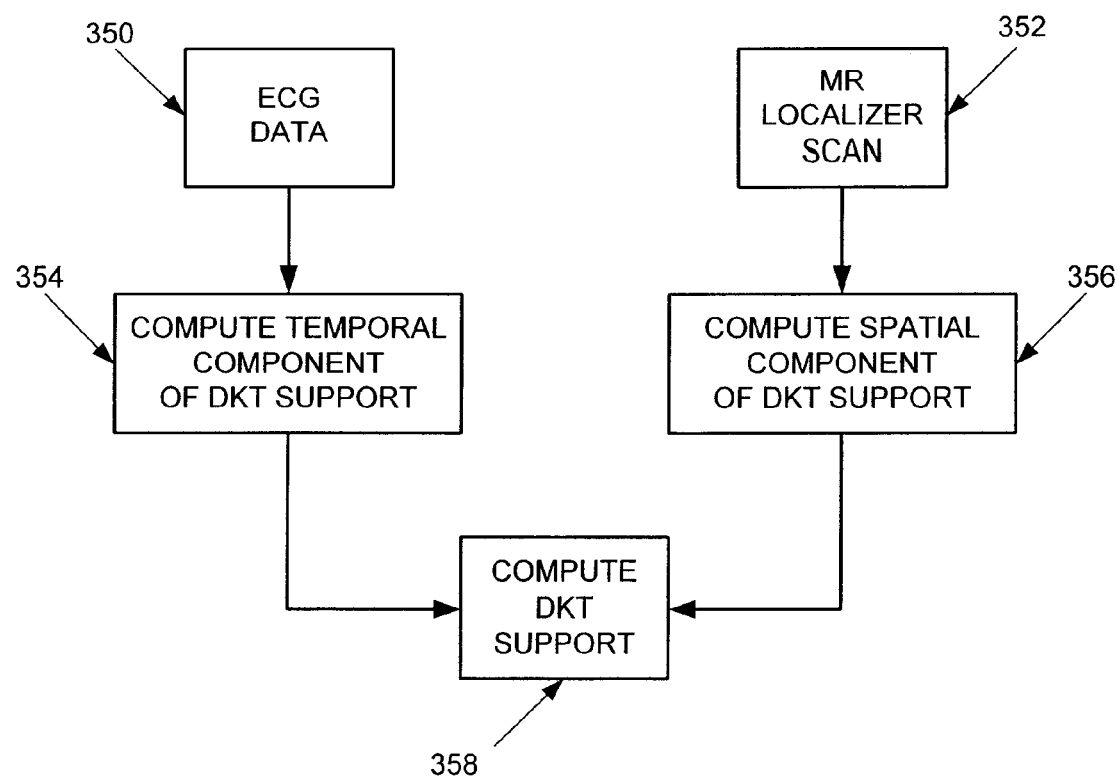

There are two alternative methods for measuring the DKT support of the TVO as illustrated in FIGS. 9(*a*)-(*b*). We begin by describing the method illustrated in FIG. 9(*b*). In this embodiment, we use an MR localizer scan to estimate the spatial components of the DKT support model, i.e., the FOV and the D-FOV. These parameters can be derived from the localizer scan by automatically segmenting the dynamic cardiac region in the image field-of-view or by manually designating the cardiac region. Alternatively, either the FOV or DFOV or both can be grossly estimated by other physical measurements on the subject. Such gross estimates can be further refined using previously tabulated data bases. ECG or other cardiac monitor data for the subject is also collected and used to estimate the temporal components of the DKT support model, namely ($f_0$,h,w) (i.e., the center frequency of the first harmonic band, the number of harmonic bands and their width). Such estimation may rely on the computation of the temporal Fourier transform of the cardiac monitor data, or other extraction of frequency or period information. Estimates of the significant number of harmonics and width of harmonic bands may rely on previously tabulated data-bases which correlate these quantities to the measured cardiac monitor data and results of the localizer scan.

Another embodiment for estimating the DKT support does not require collection of auxiliary, non-MR data. Such an approach is outlined in FIG. 9(*a*) and will be described next. First, we note that the DKT support as defined by Eq. (4), can also be expressed as:

$$\beta_I = \bigcup_{k_x} \underbrace{\text{supp}\{I(k_x, y, f)\}}_{B_I(k_x)} \quad \text{Eq. (15)}$$

This indicates that we can estimate the marginal DKT support $\beta_I(k)$ for a sufficiently dense set of $k_x$-sample locations ($k_x^0$, $k_x^1$, ..., $k_x^N$) and then estimate the required DKT support by forming the union of these marginal supports.

Figure 5:
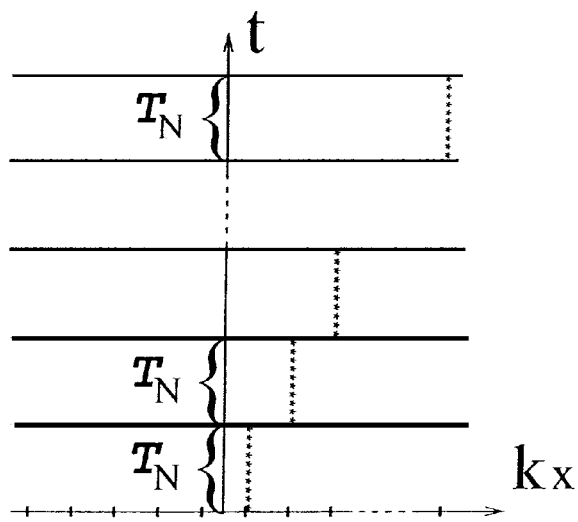
FIG. 5 is a graphic illustration of a k-space sampling schedule that may be employed during a prescan stage of the preferred method to estimate the DKT support for the imaged object.
Figure 6:
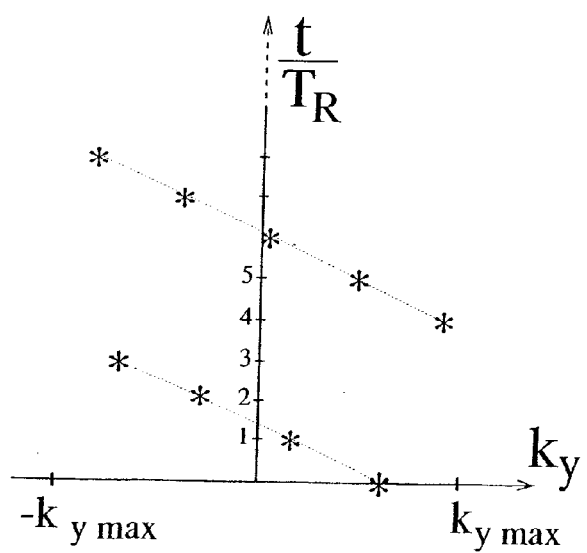
FIG. 6 is a graphic illustration of the resulting k-space sampling schedule that may be employed during the imaging phase of the preferred method.

FIG. 5 shows a sampling schedule $\Psi^{DME}$ that is used to estimate the required DKT supports by sequentially estimating the marginal DKT supports. In FIG. 5, a point at ($k_x^0$,t) indicates an MR acquisition at time $t_0$ of a line in k-space with $k_y$ being the readout direction and $k_x^0$ being the sampling location in the phase-encode direction. As seen from the figure, we acquire such k-space data for a fixed $k_x^0$ at a constant temporal rate, over a period of time $T_N$, sufficient to obtain an estimate of the DKT support. For a heart beating at 1 Hz, we may need to acquire such navigator data for a few tens of seconds. This acquisition then provides us with the data set $\{I_l(k_x,k_y,t)\}_{\Psi^{DMA}}^{l=1 \cdots L}$, i.e., the function $I(k_x,k_y,t)$ sensed by the l-th coil (l=1, ..., L where L is the number of parallel receiver channels and l=0 for the body coil, if present) when sampled according to the DME sampling schedule $\Psi^{DME}$. Note that due to inductive coupling, the body coil and the array of surface coils cannot be operated simultaneously, thus requiring acquisition of the DME data in two succeeding steps. Panel 360 of FIG. 10 illustrates the data that is acquired for a fixed $k_x$-sample location ($k_x^0$).

When body coil data is available, we take a 2D Fourier transform of $\{I_l(k_x,k_y,t)\}_{\Psi^{DMA}}{}^{l=0}$ (w.r.t. $k_y$ and t; for $kx=k_x^0$), to obtain the DKT domain function $g_0(y,f)$. In the absence of a body coil or in case we choose not to collect the body coil data, we compute $g_0{}^l(y,f)$ as the 2D Fourier transform of $\{I^l(k_x,k_y,t)\}_{\Psi^{DMA}}{}^{l=1\ldots L}$ w.r.t. $k_y$ and t; for $k_x=k_x^0$; for $l=1,\ldots,L$. Next, we compute the DKT function using the following sum-of-squares formula:

$$g_0(y,f) = \sum_{l=1}^{L} |g_0^l(y,f)|^2 \qquad \text{Eq. (16)}$$

Having computed $g_0(y,f)$ using either of the methods described above, we threshold the result in order to obtain the marginal DKT support estimate $\beta_1(k_x^0)$ shown in panel 364. The thresholding removes the artifacts in the DKT support due to the subject's breathing or other effects during the MR data acquisition. Instead of thresholding, we can also fit a parametric model to the support of the data shown in panel 362, to compute the DKT support model parameters. For instance, the marginal DKT support may be characterized in terms of the dimensions of the FOV (FOV), the dimensions of the dynamic FOV (DFOV), the harmonic frequency ($f_0$), width of harmonic bands (w), and number of significant harmonic bands (h). Then for a measured DKT function $g_0(y,f)$, the marginal DKT support to be used in the model can be found by solving the following optimization problem:

$$\underset{\beta(FOV,DFOV,f_0,h,w)}{\operatorname{argmin}} E_\beta(g_0(y,f)) + c(\beta) \qquad \text{Eq. (17)}$$

where $\beta(\cdot)$ defines the DKT support for a given set of parameters (FOV, DFOV, $f_0$, h, w); the quantity $E_\beta(g_0(y,f))$ measures the fraction of the mass or energy of $g_0(y,f)$ that is contained outside the set $\beta$; and $c(\beta)$ penalizes the size of the set $\beta$, for instance by measuring its area. Such an optimization problem can be solved numerically in order to compute the marginal DKT support. Minimizing the quantity in Eq. (17) provides an estimate of the DKT support that balances two conflicting aspects: (i) the match to the measured DKT domain function $g_0(y,f)$; and (ii) the cost $c(\beta)$, which may be related to, for instance, the required $T_R$ for a valid sampling schedule for an object with DKT support $\beta(\cdot)$. By giving up a little on the fit to $g_0(y,f)$, the artifacts introduced into the reconstruction will have a small non-zero energy, but the requirements on $T_R$ may be advantageously relaxed. Furthermore, because $g_0(y,f)$, is only an estimate, possibly contaminated by respiratory artifacts, a perfect fit to $g_0(y,f)$, is not desired. It is also clear that there is great flexibility available in the choice of the energy function $E_\beta(\cdot)$, and cost function $c(\beta)$, that can be used to tailor the optimization problem and resulting tradeoff to the particular application.

Instead of combining the DME data from all coils and then proceeding to compute the DKT support, an alternative method is the following two-step method. First, we compute the marginal DKT support as sensed by each of the receiver coils by replacing $g_0(y,f)$ in Eq. (17) by $|g_0^l(y,f)|^2$. Next, we take the estimated DKT support to be the union of all the marginal DKT supports.

Recall that the DME data can be acquired at multiple sampling locations in $k_x$. By computing the 2D Fourier transform of the data (w.r.t. $k_y$ and t) acquired for each of these sampling locations we obtain a series of DKT domain functions $g_0(y,f), g_1(y,f), \ldots, g_n(y,f)$. We jointly estimate the DKT support to be used in the model, by solving the following modified version of optimization problem outlined in Eq. (17):

$$\underset{\beta(FOV,D-FOV,f_0,h,w)}{\operatorname{argmin}} \sum_{n=0}^{N} \lambda_n E_\beta(g_n,(y,f)) + c(\beta) \qquad \text{Eq. (18)}$$

where the parameters $\lambda_n$ can be used to weight the influence of the different $k_x$ sample locations. This approach, although more complicated, can provide better estimates of the DKT support compared to that of Eq. (17).

As mentioned in the general description of the invention, the dynamic model estimate can be further refined during the MR data acquisition step. For example, the dynamic model can be updated using by performing a spectral analysis on the MR data as it is being acquired during the imaging scan. The improved dynamic model estimate could then be used to either update the sampling schedule online or in the image reconstruction stage.

The final step in the prescan process 250 of FIG. 8 is to calculate the optimal time-sequential sampling schedule at process block 256 and store it in the sampling schedule 258. We use the estimated DKT support $\beta_1$ and the set of coil sensitivity profiles at this stage to determine the sampling schedule. The sampling schedule also depends upon the set of imaging parameters such as the desired image resolution along the phase-encode direction, as well as the predefined image-acquisition cost function in Eq. (2).

DESIGN OF THE SAMPLING SCHEDULE: The method for calculating the sampling schedule 258 will now be described. In general the time-sequential (TS) sampling schedule 258 contains information about: (1) time-instants at which MR data is acquired; (2) the slice that is excited and k-space point or k-space trajectory sampled at each of those time-instants. In the preferred embodiment (spinwarp imaging of a single 2D slice) the sampling schedule is a list that indicates the order in which the $k_y$ phase encodings are to be applied when acquiring image data from the subject of the examination and the time instants at which each such view should be acquired. Recall that the same k-space location or view, may be sampled multiple times at different acquisition time instants, the number of repetitions determined by considerations including: desired temporal coverage and image quality, shape of the DKT support (in particular width of the bands), and limits on acquisition time. We now describe how the TS sampling schedule is designed based on the previously estimated DKT support $\beta_1$ at process block 254, the coil sensitivities estimated at process block 252, and the desired imaging parameters, especially the desired spatial resolution, and image-acquisition cost function.

In a 2D parallel imaging acquisition, each receiver coil is characterized by its two-dimensional spatial sensitivity function $s_l(r)$. Given L coils, each with complex spatial sensitivity $s_l(r)$, $l=1, 2, \ldots, L$, the data acquired by the l-th coil for a TVO is samples of the following function:

$$D_l(k,t) = \int_{FOV} s_l(r) I(r,t) e^{-j2\pi k^T r} dr \qquad \text{Eq. (19)}$$

where $r=[x\ y]^T$ for 2D imaging.

Acquisition along the frequency encoding ($k_x$) direction is sufficiently fast to be assumed instantaneous relative to the temporal dynamics of the image. Therefore, the effect of the sampling along $k_x$ is ignored in our analysis. Consequently, we have a 2D sampling problem in ($k_y$,t) domain where each point stands for a line, or view, in ($k_x$, $k_y$).

Following the TS sampling theory, as presented in "Lattice Theoretic Analysis of time-sequential sampling of spatio-temporal signals, Part I", by N. P. Willis and Y. Bresler, IEEE Transactions of Information Theory, vol 43, pp 190-207, 1997, we search for sampling schedules that lie on a (rational) ($k_y$,t) lattice $\Lambda_A$, defined as follows:

$$\Lambda_A = \left\{ (k_y, t) : \begin{bmatrix} k_y \\ t \end{bmatrix} = Am; m \in \mathbb{Z}^2 \right\} \quad \text{Eq. (20)}$$

where $\mathbb{Z}$ denotes the set of integers and $A \in \mathbb{R}^{2\times 2}$ (referred to as the basis of the lattice $\Lambda_A$) is an upper triangular matrix of the following form:

$$A = \begin{bmatrix} a_{11} & a_{12} \\ 0 & a_{22} \end{bmatrix} \quad \text{Eq. (21)}$$

A general sampling schedule will not satisfy the TS sampling constraint that restricts us to acquiring only one phase-encode line at a given time-instant. To account for this constraint, we first note that in order to reconstruct the TVO to a given spatial resolution, we need to acquire MR data only for a certain set of phase-encodes κ. In general the frequencies in set κ need not be contiguous, but for clarity we discuss the special case in which κ is defined by a range of spatial frequencies $x=[k_{y,min}, k_{y,max}]$ and furthermore $k_{y,min}=-k_{y,max}$. We then define a sampling schedule determined by a lattice $\Lambda_A^*$, and the desired phase-encode range, as follows:

$$\Psi_A^\kappa = \{(k_y, t) : (k_y, t) \in \Lambda_A, k_y \in \kappa\} \quad \text{Eq. (22)}$$

Hence, we acquire data for only those sets of phase-encodes which fall within the range determined by the required spatial resolution.

In order for the sampling schedule $\Psi_A^\kappa$ to satisfy the TS constraint, we need the lattice with the basis matrix $[a_{11}] \in \mathbb{R}^{1\times 1}$ to pack the set κ. This can be shown to be equivalent to the condition $a_{11} \geq 2k_{y,max}$. Furthermore, if we choose $a_{11}=2k_{y,max}$ then the resulting sampling schedule will indicate acquisition of data at a constant temporal rate (referred to as temporally-uniform sampling), i.e., fixed $T_R(=a_{22})$.

For a lattice $\Lambda_A$, a polar lattice $\Lambda_A^*$ is defined as the lattice whose basis is the matrix $A^{-T}$ (i.e transposing the matrix A and then forming its inverse). Consider a temporally-uniform TS sampling lattice $\Lambda_A$ with basis matrix A. Following the discussion above, it follows that:

$$A^* = A^{-T} = \begin{bmatrix} \frac{1}{2k_{y,max}} & 0 \\ \frac{-a_{12}}{(2k_{y,max}T_R)} & \frac{1}{T_R} \end{bmatrix} = \begin{bmatrix} \frac{1}{2k_{y,max}} & 0 \\ b_{21} & b_{22} \end{bmatrix} \quad \text{Eq. (23)}$$

According to multi-dimensional sampling theory, sampling on a lattice $\Lambda_A$ in ($k_y$,t) results in replications of the spectrum in the reciprocal domain, i.e., the DKT or the (y,f) domain. The replication is equivalent to convolution of the spectrum in (y, f) domain with the following point spread function:

$$h(y, f) = \frac{1}{|det(A)|} \sum_{n \in \mathbb{Z}^2} \delta\left( \begin{bmatrix} y \\ f \end{bmatrix} - A^*n \right) \quad \text{Eq. (24)}$$

where δ denotes the Dirac delta function (distribution). The transformed MR measurements, $d_l(y,f)$, are:

$$d_l(y, f) = \int\int \sum_{m \in \mathbb{Z}^2} D_l(Am)\delta\left(\begin{bmatrix} k_y \\ t \end{bmatrix} - Am\right) e^{-j2\pi(ft-k_y y)} dk_y dt \Rightarrow \quad \text{Eq. (25)}$$

$$d_l(y, f) = \frac{1}{|det(A)|} \sum_{n \in \mathbb{Z}^2} s_l(y - \Delta y_n) I\left(\begin{bmatrix} y \\ f \end{bmatrix} - A^*n\right)$$

where $\Delta y_n = \begin{bmatrix} 1 \\ 0 \end{bmatrix}^T \left(\begin{bmatrix} y \\ f \end{bmatrix} - A^*n\right)$.

Figure 11:
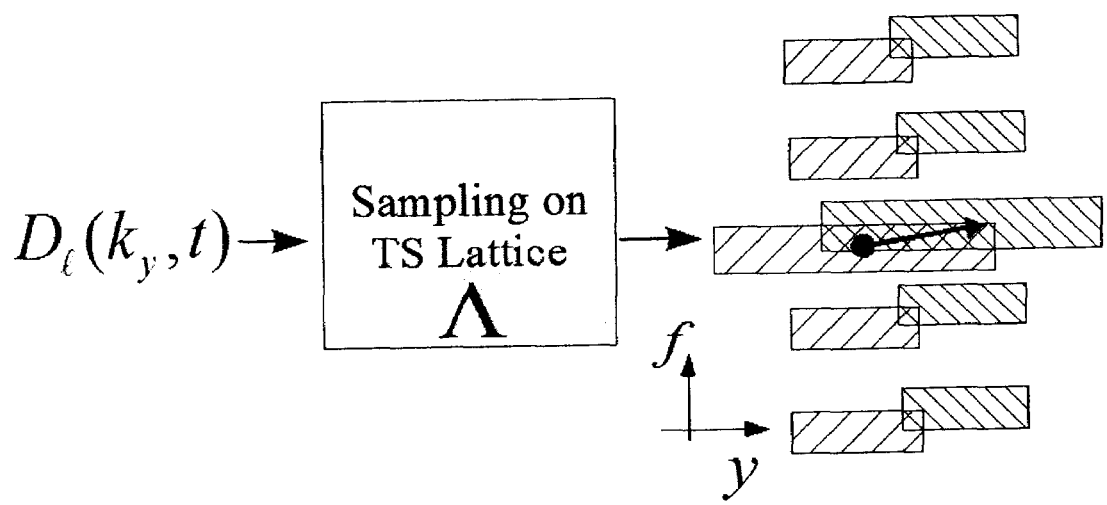
FIG. 11 is a pictorial view which depicts the effect of sampling in the DKT domain which corresponds to part of the scanning method of FIG. 8.

For a point $(y_0, f_0) \in \beta_1$ and a lattice with basis A, define $$Q(y_0, f_0) = \left\{ \begin{bmatrix} y \\ f_0 \end{bmatrix} \in B_1 / \exists \vec{n} \in \mathbb{Z}^2 s.t. \begin{bmatrix} y \\ f \end{bmatrix} = \begin{bmatrix} y_0 \\ f_0 \end{bmatrix} - A^*\vec{n} \in B \right\} \quad \text{Eq. (26)}$$

which we refer to as the equivalence class (EC) of the DKT point $(y_0, f_0)$. From Eq. (25) it follows that for a fixed $(y_0, f_0) \in \beta_1$, the set $Q(y_0, f_0)$ contains all the points in $\beta_1$ that alias with $(y_0, f_0)$ when I(r,t) is sampled on $\Lambda_A$. FIG. 11 illustrates this aliasing; the two ends of the arrow in the figure mark members of an EC. It can be shown that the set of all ECs provides a partitioning of $\beta_1$. Now, for a fixed EC $Q(y_0, f_0)$ with a representative member $(y_0, f_0) \in \beta_1$, Eq. (25) is written in matrix form as follows:

$$d(y_0, f_0) = S(y_0, f_0) I(y_0, f_0)$$

where $d(y_0, f_0) = [d_1(y_0, f_0) \ldots d_L(y_0, f_0)]^T$ is the collection of transformed measurements from all the coils, and $$I(y_0, f_0) = \left[ I\left(\begin{bmatrix} y_0 \\ f_0 \end{bmatrix} - A^*\vec{n}_1\right) \ldots I\left(\begin{bmatrix} y_0 \\ f_0 \end{bmatrix} - A^*\vec{n}_R\right) \right]^T$$

contains the set of unknowns at locations $(y,f) \in Q(y_0,f_0)$ and R is the number of elements in the EC. The $S(y_0,f_0)$ matrix is the forward matrix consisting of coil sensitivities. It is of size L×R and its l-th row is given by:

$$\frac{1}{|det(A)|} [s_l(y_0 - \Delta y_{n_1}) \ldots s_l(y_0 - \Delta y_{n_R})]$$

In a practical setting, the measurements are corrupted by additive noise. Hence, the previous matrix equation becomes:

$$d(y_0, f_0) = S(y_0, f_0) I(y_0, f_0) + v(y_0, f_0) \quad \text{(Eq. 27)}$$

where $v(y_0, f_0)$ is corresponding noise vector.

A necessary and sufficient condition for the linear inverse problem in Eq. (27) to be solvable is for $S(y_0, f_0)$ to have a left inverse, i.e., to have full column rank. For a given set of coil sensitivities, if all of the ECs for a lattice $\Lambda_A$ and support $\beta_1$ satisfy this condition, we call that lattice "$\beta_1$-reconstructible." Under this condition any object with DKT support $\beta_1$ can be reconstructed from the data sampled on $\Lambda_A$.

A general sampling design algorithm, formulated in Eq. (2), finds a TS lattice $\Lambda_A$ which is $\beta_1$-reconstructible and that optimizes a predefined quality measure. In one embodiment, the optimality criterion is chosen to be the expected reconstruction error (averaged over all time and spatial locations) due to noise in the MR data. For a given EC, define $\Phi(y_0,f_0)=E[v(y_0,f_0)v(y_0,f_0)^H]$ to be the noise covariance matrix of the noise vector in Eq. (27). It can be shown that $\Phi(y_0,f_0)$ is independent of $(y_0,f_0)$ and is proportional (with a known constant of proportionality) to the covariance matrix in the data domain (k-t space). The data domain noise covariance matrix is estimated using standard techniques, such as those described in the article by R. M. Henkelman, "Measurement of signal intensities in the presence of noise in MR images," Medical Physics, vol. 12, pp. 232-233, 1985. In what follows, we will denote the y-f domain noise covariance matrix by $\Phi$.

Discretizing the $\beta_1$ support by decomposing it to a set of box-shaped pixels of size $\alpha$ and partitioning the set of pixels to ECs $\{Q_i\}_{i=1}^c$ as defined in the last section, it can be shown that the average reconstruction error due to noise is given by:

$$\bar{\varepsilon} = E\|I^* - I\|_2^2 = \alpha \sum_{i=1}^c \text{trace}\{(S_i^H \Phi^{-1} S_i)^{-1}\} \qquad \text{Eq. (28)}$$

where $S_i$ denotes the corresponding S matrix for $Q_i$, as described above.

Considering Eq. (23), we search for $b_{21}$, $b_{22}$ (which, as seen from Eq. (23), specify the basis of the polar lattice) over a discretized grid such that the number of coils L is greater than or equal to the number of elements in $Q(y_0,f_0)$ for all $(y_0,f_0)\in\beta_1$. This eliminates most of the lattices which are not $\beta_1$-reconstructible. Furthermore, we choose the $(b_{21}, b_{22})$ pair which corresponds to a lattice with the smallest $\bar{\varepsilon}$. Given this optimal lattice, the sampling schedule is determined through Eq. (22). This sampling schedule is guaranteed to satisfy the TS sampling constraint and achieve the optimal image quality.

The sampling schedule design algorithm can be easily adapted to, incorporate several practical imaging constraints. For instance, due to hardware and specific absorption rate (SAR) limits, we may need to enforce a lower limit on the sampling interval $T_R$. Note that $T_R=1/b_{22}$ and hence this constraint can be easily enforced in the sampling design optimization algorithm described above. Other examples include an upper limit on the total acquisition time, or a combination of all such constraints. Alternatively, given a maximum allowable reconstruction error $\bar{\varepsilon}$, one can find the TS sampling design with minimum possible $T_R$. Besides the expected reconstruction error, expected signal-to-noise ratio (SNR) or contrast-to-noise ratio (CNR) can also be optimized.

IMAGE RECONSTRUCTION A preferred method for reconstructing an image at process block 268 (FIG. 8) using the acquired k-space data, the DKT support and coil sensitivity profiles will now be described. Eq. (19) is an example of a linear transformation (Fredholm integral equation of the first kind) from the object domain (r,t) to the data domain (k,t). Reconstructing the object I(r,t) from available samples of $D_l(k,t)$ is a classical linear inverse problem and methods for reconstruction are discussed in several texts, for instance, "Introduction to Inverse Problems in Imaging", by M. Bertero and P. Boccacci, IOP Publishing Ltd., 1998. Furthermore, several numerical methods for solving such problems are discussed in a book by Per Christian Hansen entitled "Rank-Deficient and Discrete Ill-Posed Problems: Numerical Aspects of Linear Inversion", ISBN:0-89871-403-6, SIAM, Philadelphia, 1999.

Given the special structure of the observation in Eq. (1), the DKT support object model and the lattice sampling locations, we derive very efficient algorithms for reconstructing the TVO from the acquired, parallel MR data. One such embodiment is described below.

Consider the problem of reconstructing the cine I(x,y,t) at specified time-instants for a fixed $x=x_0$. Given the MRI data, we compute d(y,f) for all (y,f) using Eq. (25). Then, for a fixed $(y_0,f_0)\in\beta_1$, we solve the system of linear equations in Eq. (27) to recover I(y,f) for all $(y,f)\in Q(y_0,f_0)$. This is possible since we have guaranteed that a solution of Eq. (27) exists for all $(y_0,f_0)\in\beta_1$, when we selected the sampling schedule to be $\beta_1$-reconstructible. Repeating the process for different points in the DKT support, we recover I(y,f) for all $(y,f)\in\beta_1$.

In a practical setting, the coil measurements are corrupted by additive noise. If an estimate of the noise covariance matrix is available (which is usually the case in MRI), the optimal solution for Eq. (27) is the linear minimum-variance estimate:

$$I^*(y_0,f_0)=[S(y_0)^H\Phi^{-1}S(y_0)]^\dagger S(y_0)^H\Phi^{-1}d(y_0,f_0) \qquad \text{Eq. (29)}$$

where † denotes the Moore-Penrose pseudo-inverse for the term in parenthesis. Alternatively, various forms of regularization such as Tikhonov-type techniques can be applied, including those described in the book by P. C. Hansen entitled "*Rank-Deficient and Discrete Ill-Posed Problems: Numerical Aspects of Linear Inversion*", ISBN:0-89871-403-6, SIAM, Philadelphia, 1999. The solution to Eq. (29) is computed using stable numerical methods such as those described in the cited book.

Following the above steps we recover I(y,f) (for the fixed $x=x_0$) for all points within its DKT support. Furthermore, since I(y,f) is known to be negligible outside its DKT support $\beta_1$, computing I(y,f) for all points in the DKT support is sufficient for recovery of I(y,t). Specifically, the TVO I(y,t) can be reconstructed at the desired time instants, by computing the inverse Fourier transform of I(y,f) with respect to f. The process can be repeated for different values of $x_0$ on a discrete grid with spacing $\Delta x$ determined by the desired spatial resolution, in order to recover the complete cine I(x,y,t) at specified resolution and time instants. A flowchart summarizing the preferred reconstruction algorithm is depicted in FIG. 12.

Denote the length of the FOV along x and y by $W_x$ and $W_y$, respectively, and the number of desired pixels along x and y by $N_x$ and $N_y$, respectively. Note that the parameter $N_y$ and the parameter $k_{y,max}$ that was used while designing the sampling schedule are inter-related since $N_y=2W_yk_{y,max}$. We also, define the period of the lattice, $N_p=b_{22}/\gcd(b_{21},b_{22})$ where $b_{21}$ and $b_{22}$ are defined in Eq. (23). The number of data samples collected is denoted by $N_t$.

Figure 12:
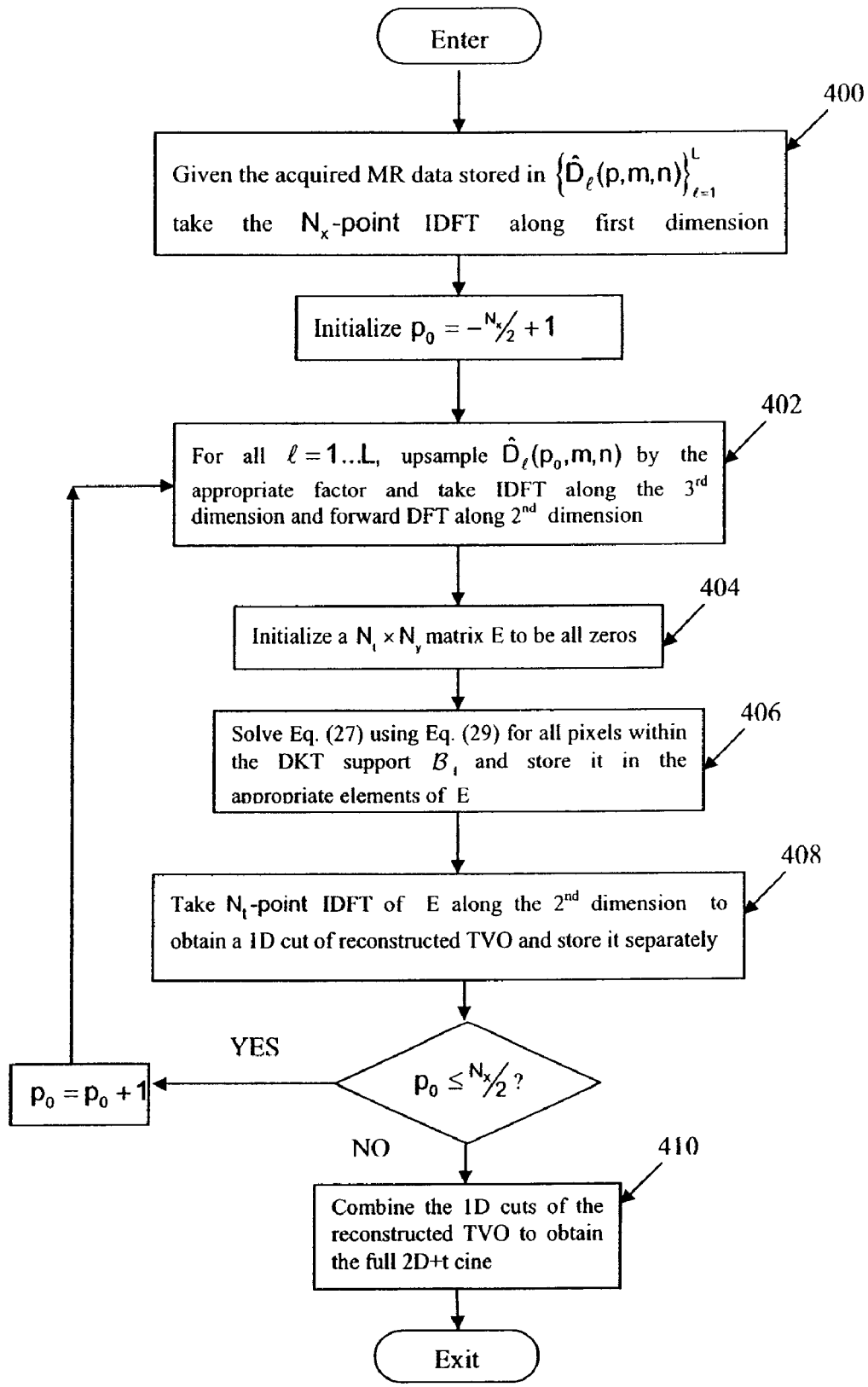
FIG. 12 is a flow chart of the steps in the image reconstruction phase, which forms part of the method of FIG. 8.

Referring particularly to FIG. 12, for each of the L coils, we store the data measured by the l-th coil in a 3D matrix $\hat{D}_l$ referred to as the data matrix of the l-th coil. The element $\hat{D}_l(p,m,n)$ of the data matrix corresponds to $D_l(p\Delta k_x, m\Delta k_y, nT_R)$ where $\Delta k_x=1/W_x$ and $\Delta k_y=2k_{y,max}/N_p$ ($-N_x/2+1\leq p\leq N_x/2$; $-N_p/2+1\leq m\leq N_p/2$; $1\leq n\leq N_t$). The data matrix at this point represents measurements in the $(k_x,k_y,t)$ domain. Given the data matrices of all the L coils $\{\hat{D}_l(p,m,n)\}_{l=1}^L$, the $N_x$-point inverse Discrete Fourier Transform (IDFT) along the first dimension (corresponding to $k_x$) for each of $\hat{D}_f(p,m,n)$ is computed and stored in the same data matrix as indicated at process block 400. Thus the data matrix now represents entries in the $(x,k_y,t)$ domain.

A loop is then entered in which each iteration reconstructs a 1D cross section along y of the discretized object for a fixed x location of $p\Delta x$. In each iteration of the loop, four steps are performed for a fixed $p=p_0$ which is initialized to be $p_0=N_x/2+1$.

First, for each of the coils, we upsample the data matrix along its second dimension (corresponding to $k_y$) by a factor of $\lceil N_y/N_p \rceil$ where $\lceil u \rceil$ is defined as the smallest integer larger than or equal to u. This involves interpolating the $N_p$ entries along the second dimension to a denser grid with $(N_p \lceil N_y/N_p \rceil)$ points using a desired interpolator such as the sinc-interpolator, or its discrete-time version, a Dirichlet-kernel interpolator, or another desired interpolation kernel, which can be computed efficiently using standard signal processing techniques.

The $N_t$-point forward DFT (discrete Fourier transform) along the third dimension (corresponding to t) and the $(N_p \lceil N_y/N_p \rceil)$-point IDFT (inverse DFT) along the second dimension (corresponding to $k_y$) is computed and the result is truncated to $N_y$ points (along the second dimension) as indicated at process block 402. Thus the data matrix entries are now transformed to the $(x,y,f)$ domain.

A $N_y \times N_t$ temporary matrix E (representing entries in $(y, f)$ domain for the fixed $x_0$) is initialized to be all zeros as indicated in process block 404. A solution to Eq. (27) is found at process block 406 using Eq. (29) for discretized pixel locations in $\beta_1$. The results are stored in E at the appropriate locations in the $N_y \times N_t$ matrix with the remaining entries, corresponding to pixel locations outside $\beta_1$ remaining unchanged, i.e., having zero value.

Finally, the $N_t$-point IDFT along the second dimension (corresponding to f) of the E matrix is computed at process block 408 that gives a 1D cross section (along the y direction) of the reconstructed TVO in (y,t) for the fixed $x_0$ location and is stored separately.

The pixel index $p_0$ is then incremented by 1 and the loop is repeated as long as $p_0 \leq N_x/2$ is within the region of interest along the x direction (in the image domain). After the loop is executed, the complete cine (a discrete representation of $I(x,y,t)$) is recovered by combining the stored 1D cuts as indicated in process block 410. A preferred method for computing all DFT and IDFT used in the reconstruction scheme is the standard 1D or 2D Fast Fourier Transform (FFT) routine.

A number of variations of the above described reconstruction process should be apparent. For instance, an alternative embodiment would be the use of fast non-uniform transform techniques instead of the conventional FFT in process blocks 402 and 406 of FIG. 12. An example of such techniques is the Sparse Data FFT described in an article entitled "A Sparse Data Fast Fourier Transform (SDFFT)" by A. A. Aydiner et al., IEEE Transactions on Antennas and Propagation, vol. 51, pp. 3161-3170, 2003.

Other embodiments include imaging methods for Time-Warped Cardiac Models such as the Time-Warped Banded Spectral Model in addition to parametric object models such as the Time-Warped Harmonic Model as described above.

The invention claimed is:

1. A method for acquiring and producing images of a time-varying subject with a magnetic resonance imaging (MRI) system equipped with parallel imaging hardware, the steps comprising:

a) performing a prescan of the time-varying subject that includes:
  a)i estimating coil characteristics for a plurality of receiver coils in the parallel imaging hardware;
  a)ii estimating a dynamic model for the time-varying subject;
  a)iii computing a dynamic sampling schedule using the estimated dynamic model and coil characteristics, the sampling schedule including information indicative of the position in k-space, order and timing at which k-space image data is to be acquired; and
b) performing a scan of the time-varying subject using a pulse sequence that directs the MRI system to acquire k-space image data through the plurality of receiver coils using the dynamic sampling schedule; and
c) reconstructing an image using the k-space image data acquired in step b).

2. The method as recited in claim 1 wherein the dynamic model in step a)ii includes information about the dual-k-t support of the time-varying subject.

3. The method as recited in claim 1 in which the prescan in step a) includes acquiring data with the MRI system.

4. The method as recited in claim 1 in which coil sensitivity profiles are produced in step a)i).

5. The method as recited in claim 1 in which the coil characteristics estimated in step a)i) includes coil noise characteristics.

6. The method as recited in claim 1 in which the computing of the dynamic sampling schedule in step a)iii includes solving a mathematical optimization problem.

7. The method as recited in claim 6 in which the mathematical optimization problem includes mathematical constraints that use the dynamic model estimated in step a)ii).

8. The method as recited in claim 7, in which the dynamic sampling schedule is constrained to be an element of a feasible set of sampling schedules.

9. The method as recited in claim 1 in which reference data is acquired in step b).

10. The method as recited in claim 9 in which the reference data is acquired with the MRI system.

11. The method as recited in claim 9 in which the reference data includes subject motion information.

12. The method as recited in claim 9 in which the reference data includes subject heart rate information.

13. The method as recited in claim 1 in which the dynamic sampling schedule calculated in step a)iii) includes information indicative of at least one of (i) the timing or (ii) the k-space positions at which reference data is to be acquired.

14. The method as recited in claim 1, in which the pulse sequence employed in step b) samples k-space along parallel lines in k-space.

15. The method as recited in claim 1, in which data collected in step b) is used to calculate an improved dynamic subject model.

16. The method as recited in claim 1, in which data collected in step b) is used to calculate improved estimates of coil characteristics.

17. The method as recited in claim 1 in which the dynamic model estimated in step a)i is used in the image reconstruction in step c).

18. The method as recited in claim 1 in which coil characteristics estimated in step a)i are used in the image reconstruction in step c).

19. The method recited in claim 1 in which the reconstruction step c) includes estimation of information indicative of the aperiodicity of the time-varying subject.

20. The method as recited in claim 1 in which the time-varying subject is a beating heart.

21. The method as recited in claim 9 in which the reference data acquired in step b) is used in the image reconstruction in step c).

22. A method to reconstruct images of a time-varying subject from data collected with a magnetic resonance imaging (MRI) system equipped with parallel imaging hardware, wherein the reconstruction uses information about the subject's dual-k-t support.

23. The method as recited in claim 22 which includes estimation of information indicative of the aperiodicity of the time-varying subject.

* * * * *